(12) United States Patent
Su

(10) Patent No.: US 12,127,405 B2
(45) Date of Patent: Oct. 22, 2024

(54) 3D AND FLASH MEMORY DEVICE HAVING METAL SILICIDE SOURCE/DRAIN PILLARS AND METHOD OF FABRICATING THE SAME

(71) Applicant: MACRONIX International Co., Ltd., Hsinchu (TW)

(72) Inventor: Yan-Ru Su, Chiayi County (TW)

(73) Assignee: MACRONIX International Co., Ltd., Hsinchu (TW)

( * ) Notice: Subject to any disclaimer, the term of this patent is extended or adjusted under 35 U.S.C. 154(b) by 449 days.

(21) Appl. No.: 17/570,151

(22) Filed: Jan. 6, 2022

(65) Prior Publication Data
US 2023/0217654 A1 Jul. 6, 2023

(51) Int. Cl.
*H10B 43/27* (2023.01)
*H10B 41/10* (2023.01)
*H10B 41/27* (2023.01)
*H10B 43/10* (2023.01)

(52) U.S. Cl.
CPC ............ *H10B 43/27* (2023.02); *H10B 41/10* (2023.02); *H10B 41/27* (2023.02); *H10B 43/10* (2023.02)

(58) Field of Classification Search
CPC ........ H10B 43/27; H10B 41/10; H10B 43/10; H10B 41/27
See application file for complete search history.

(56) References Cited

U.S. PATENT DOCUMENTS

| | | | |
|---|---|---|---|
| 2010/0270529 A1* | 10/2010 | Lung ............... | G11C 13/0004 257/E47.001 |
| 2015/0364381 A1* | 12/2015 | Choi ............... | H01L 29/42356 438/268 |
| 2020/0381450 A1* | 12/2020 | Lue ................. | H10B 43/27 |

FOREIGN PATENT DOCUMENTS

| | | |
|---|---|---|
| CN | 113629054 | 11/2021 |
| TW | 201931527 | 8/2019 |
| TW | 202114181 | 4/2021 |
| TW | 202118011 | 5/2021 |
| TW | 202125723 | 7/2021 |

OTHER PUBLICATIONS

"Office Action of Taiwan Counterpart Application", issued on Aug. 5, 2022, pp. 1-7.

* cited by examiner

*Primary Examiner* — Michael Jung
(74) *Attorney, Agent, or Firm* — J.C. PATENTS

(57) ABSTRACT

A three-dimensional AND flash memory device includes a stack structure, a channel pillar, a first conductive pillar and a second conductive pillar, and a charge storage structure. The stack structure is located on a dielectric substrate and includes gate layers and insulating layers alternately stacked with each other. The channel pillar extends through the stack structure. The first conductive pillar and the second conductive pillar are located in and electrically connected with the channel pillar. The first conductive pillar includes a first metal silicide pillar, and the second conductive pillar includes a second metal silicide pillar. The charge storage structure is located between the gate layers and the channel pillar.

18 Claims, 23 Drawing Sheets

3D AND FLASH MEMORY DEVICE HAVING METAL SILICIDE SOURCE/DRAIN PILLARS AND METHOD OF FABRICATING THE SAME

BACKGROUND

Technical Field

The embodiment of the disclosure relates to a semiconductor device and a method of fabricating the same, and particularly, to a 3D AND flash memory device and a method of fabricating the same.

Description of Related Art

Since a non-volatile memory has the advantage that stored data does not disappear at power-off, it becomes a widely used memory for a personal computer or other electronics equipment. Currently, the three-dimensional (3D) memory commonly used in the industry includes a NOR memory and a NAND memory. In addition, another type of 3D memory is an AND memory, which can be applied to a multi-dimensional memory array with high integration and high area utilization, and has an advantage of a fast operation speed. Therefore, the development of a 3D memory device has gradually become the current trend.

SUMMARY

The disclosure provides a three-dimensional AND flash memory device capable of reducing the contact resistance between the source pillar/the drain pillar and the channel pillar.

The disclosure provides a method of fabricating a three-dimensional AND flash memory device, which may be integrated with the existing process to fabricate low-resistance source pillar and drain pillar and reduce the contact resistance between the source pillar/the drain pillar and the channel pillar.

A three-dimensional AND flash memory device according to an embodiment of the disclosure includes a stack structure, a channel pillar, a first conductive pillar and a second conductive pillar, and a charge storage structure. The stack structure is located on a dielectric substrate, and the stack structure includes a plurality of gate layers and a plurality of insulating layers alternately stacked with each other. The channel pillar extends through the stack structure. The first conductive pillar and the second conductive pillar are located in the channel pillar and are electrically connected to the channel pillar, and the first conductive pillar includes a first metal silicide pillar, and the second conductive pillar includes a second metal silicide pillar. The charge storage structure is located between the gate layers and the channel pillar.

A method of fabricating a three-dimensional AND flash memory device according to an embodiment of the disclosure includes the following steps. A stack structure is formed on a dielectric substrate, and the stack structure includes a plurality of intermediate layers and a plurality of insulating layers stacked alternately with each other. A channel pillar extending through the stack structure is formed. A first additional pillar and a second additional pillar are formed in the channel pillar, and the first additional pillar and the second additional pillar are respectively electrically connected to a part of the channel pillar. The first additional pillar and the second additional pillar are reacted to form a first metal silicide pillar and a second metal silicide pillar. The intermediate layers are replaced with a plurality of gate layers. A plurality of charge storage structures are formed between the gate layers and the channel pillar.

Based on the above, in the three-dimensional AND flash memory device of the embodiments of the disclosure, the source pillar and the drain pillar are fabricated using low-resistance metal and metal silicide, so the resistance of the source pillar and the drain pillar can be reduced, and the contact resistance between the source pillar/the drain pillar and the channel pillar can be reduced.

The method of fabricating the three-dimensional AND flash memory device of the embodiments of the disclosure may be integrated with the existing process to fabricate low-resistance source pillar and drain pillar and reduce the contact resistance between the source pillar/the drain pillar and the channel pillar.

DESCRIPTION OF THE EMBODIMENTS

In a three-dimensional flash memory, doped polysilicon pillars are generally used as a source and a drain. However, the resistance of doped polysilicon is high, and the contact resistance with the channel pillar is also high. In some embodiments of the disclosure, metal and metal silicide are used as a source pillar and a drain pillar. Therefore, the resistance of the source and the drain can be reduced, and the contact resistance between the source/the drain and the channel pillar can be reduced. Accordingly, the on-current ($I_{on}$) can be increased.

Figure 1A:
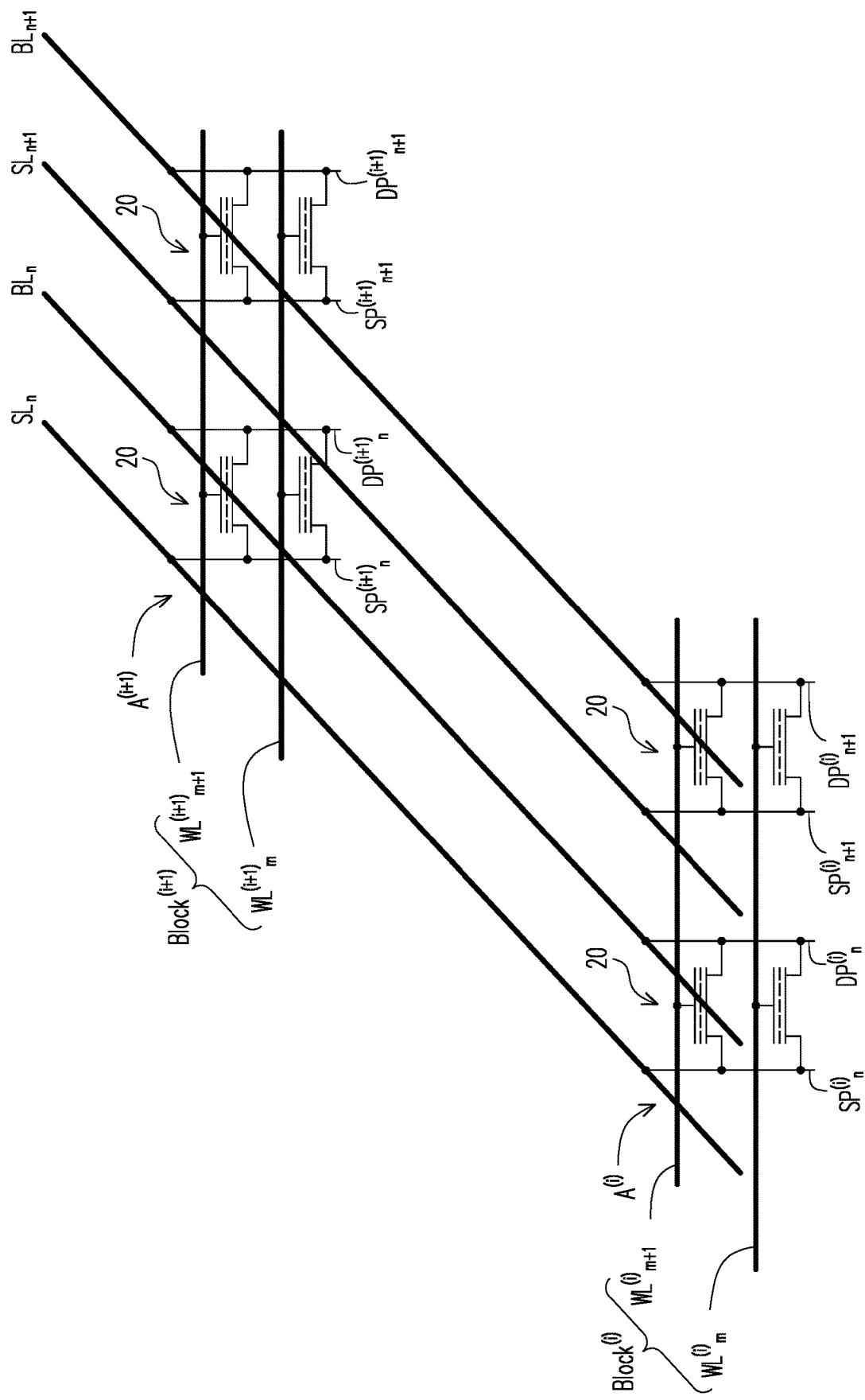
FIG. 1A shows a circuit diagram of a 3D AND flash memory array according to some embodiments.
Figure 1B:
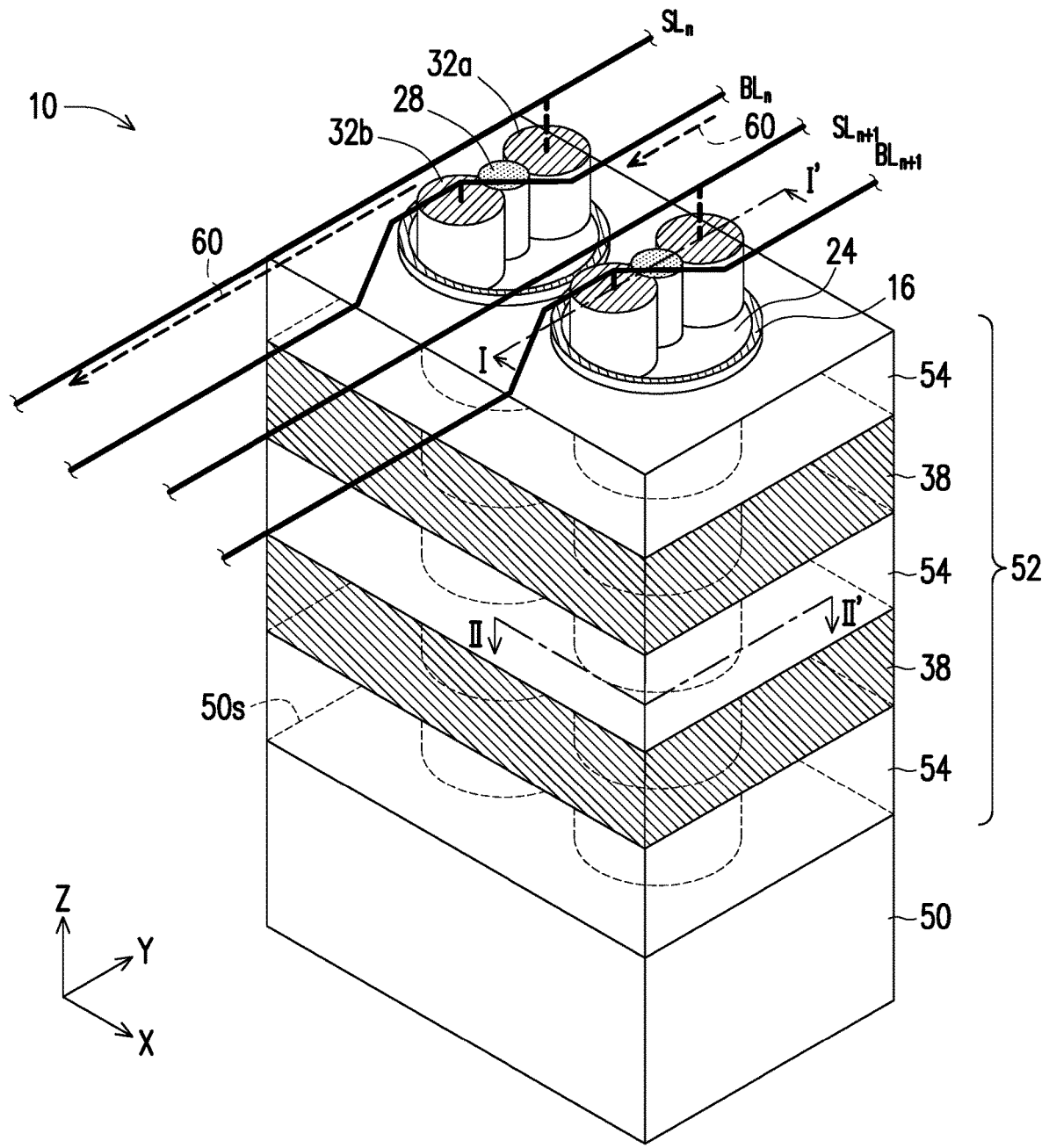
FIG. 1B shows a partial perspective view of a part of the memory array in FIG. 1A.
Figure 1C:
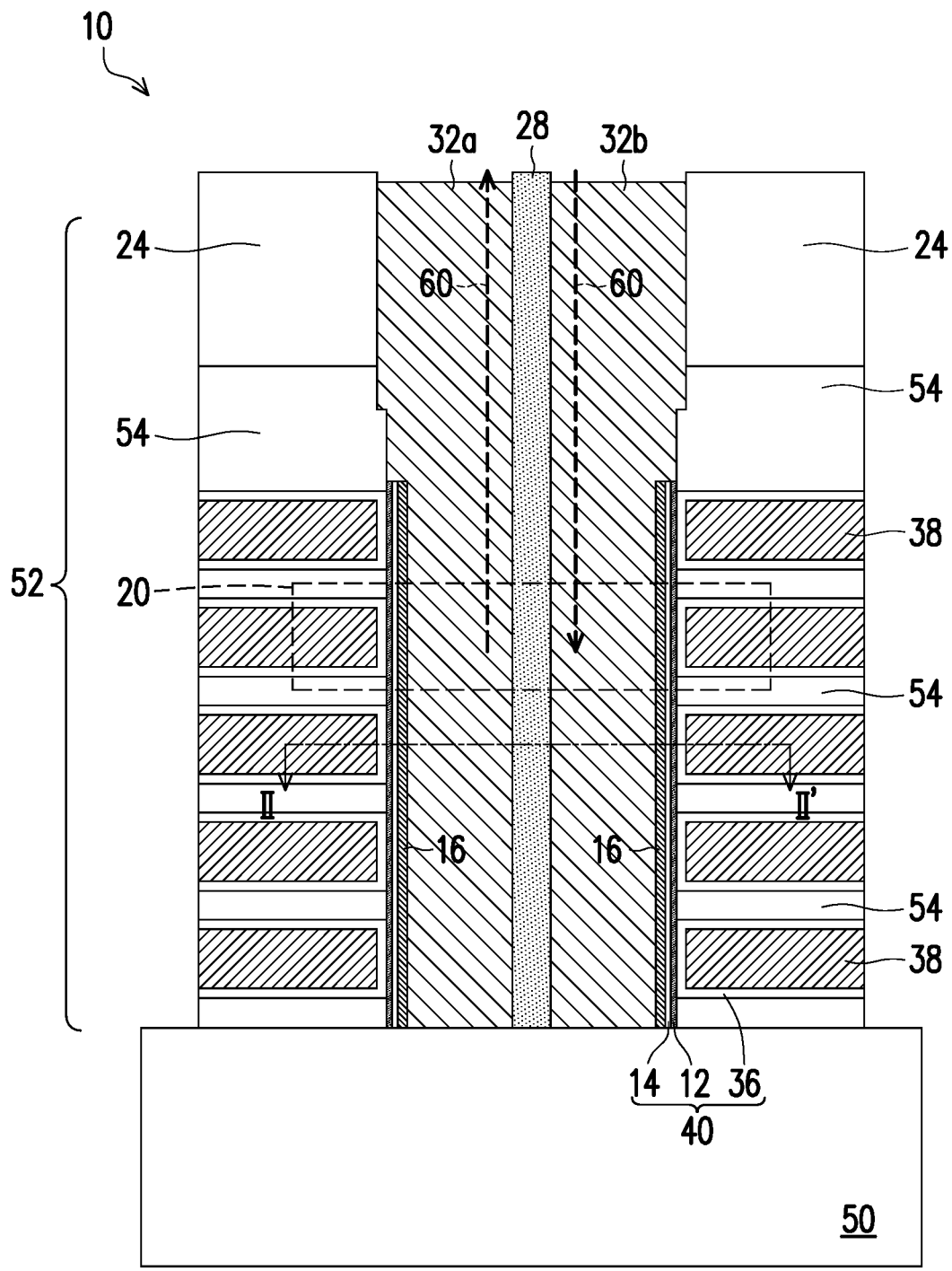
FIG. 1C and FIG. 1D show cross-sectional views taken along line I-I' of FIG. 1B.
Figure 1D:
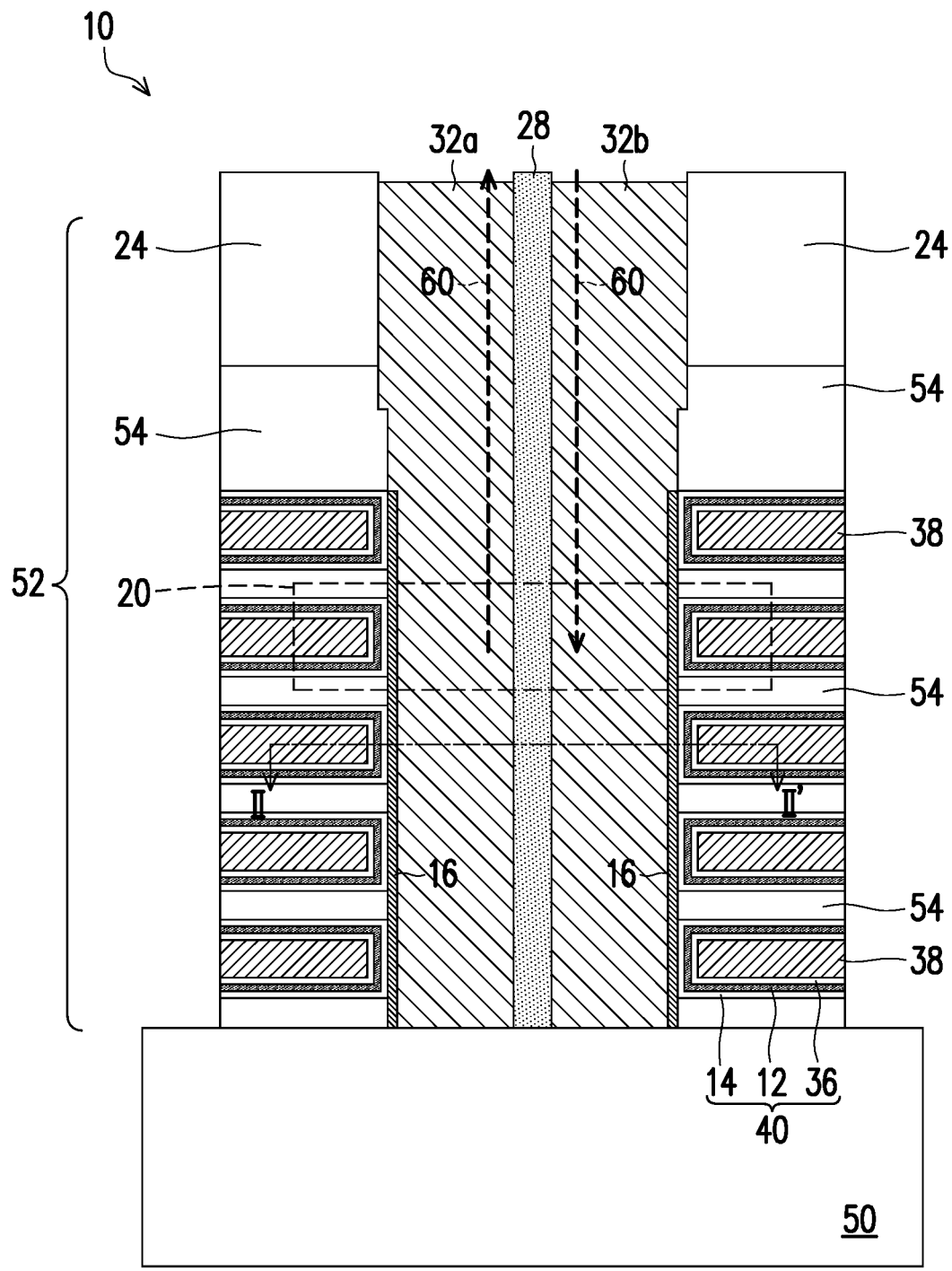
Figure 1E:
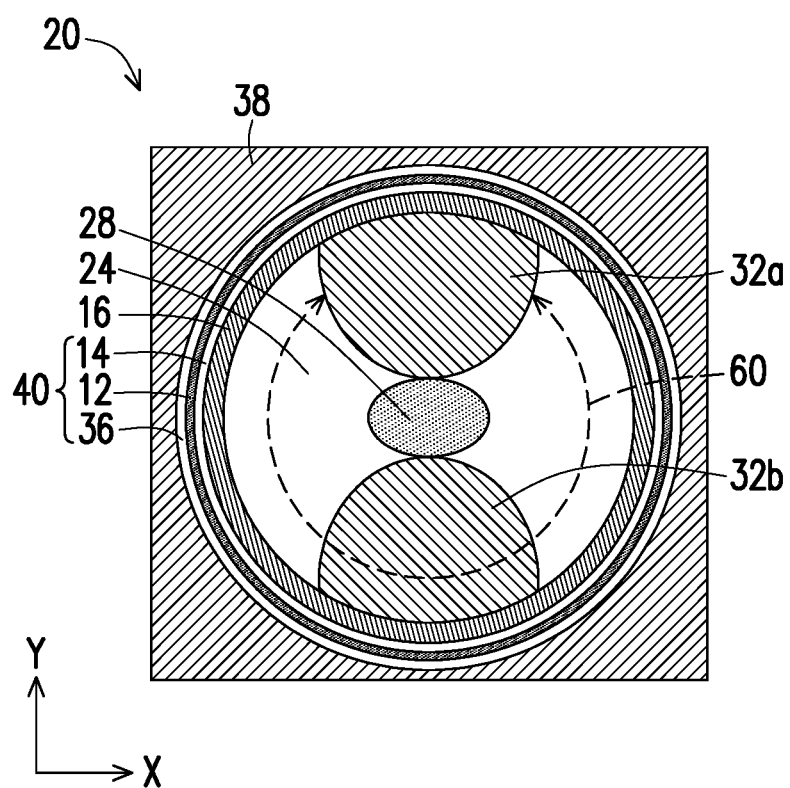
FIG. 1E shows a top view of line II-II' of FIG. 1B, FIG. 1C, and FIG. 1D.

FIG. 1A shows a circuit diagram of a 3D AND flash memory array according to some embodiments. FIG. 1B shows a partial perspective view of a part of the memory array in FIG. 1A. FIG. 1C and FIG. 1D show a cross-sectional view taken along line I-I' of FIG. 1B. FIG. 1E shows a top view of line II-II' of FIG. 1B, FIG. 1C and FIG. 1D.

FIG. 1A shows a schematic view of two blocks $BLOCK^{(i)}$ and $BLOCK^{(i+1)}$ of a vertical AND memory array 10 arranged in rows and columns. The block $BLOCK^{(i)}$ includes a memory array $A^{(i)}$. A row (e.g., an $(m+1)^{th}$ row) of the memory array $A^{(i)}$ is a set of AND memory cells 20 having a common word line (e.g., $WL^{(i)}_{m+1}$). The AND memory cells 20 of the memory array $A^{(i)}$ in each row (e.g., the (m+1)$^{th}$ row) correspond to a common word line (e.g., WL$^{(i)}_{m+1}$) and are coupled to different source pillars (e.g., SP$^{(i)}_n$ and SP$^{(i)}_{n+1}$) and drain pillars (e.g., DP$^{(i)}_n$ and DP$^{(i)}_{n+1}$), so that the AND memory cells 20 are logically arranged in a row along the common word line (e.g., WL$^{(i)}_{m+1}$).

A column (e.g., an n$^{th}$ column) of the memory array A$^{(i)}$ is a set of AND memory cells 20 having a common source pillar (e.g., SP$^{(i)}_n$) and a common drain pillar (e.g., DP$^{(i)}_n$). The AND memory cells 20 of the memory array A$^{(i)}$ in each column (e.g., the n$^{th}$ column) correspond to different word lines (e.g., WL$^{(i)}_{m+1}$ and WL$^{(i)}_m$) and are coupled to a common source pillar (e.g., SP$^{(i)}_n$) and a common drain pillar (e.g., DP$^{(i)}_n$). Hence, the AND memory cells 20 of the memory array A$^{(i)}$ are logically arranged in a column along the common source pillar (e.g., SP$^{(i)}_n$) and the common drain pillar (e.g., DP$^{(i)}_n$). In the physical layout, according to the fabrication method as applied, the columns or rows may be twisted and arranged in a honeycomb pattern or other patterns for high density or other reasons.

In FIG. 1A, in the block BLOCK$^{(i)}$, the AND memory cells 20 in the n$^{th}$ column of the memory array A$^{(i)}$ share a common source pillar (e.g., SP$^{(i)}_n$) and a common drain pillar (e.g., DP$^{(i)}_n$). The AND memory cells 20 in an (n+1)$^{th}$ column share a common source pillar (e.g., SP$^{(i)}_{n+1}$) and a common drain pillar (e.g., DP$^{(i)}_{n+1}$).

The common source pillar (e.g., SP$^{(i)}_n$) is coupled to a common source line (e.g., SL$_n$) and the common drain pillar (e.g., DP$^{(i)}_n$) is coupled to a common bit line (e.g., BL$_n$). The common source pillar (e.g., SP$^{(i)}_{n+1}$) is coupled to a common source line (e.g., SL$_{n+1}$) and the common drain pillar (e.g., DP$^{(i)}_{n+1}$) is coupled to a common bit line (e.g., BL$_{n+1}$).

Likewise, the block BLOCK$^{(i+1)}$ includes a memory array A$^{(i+1)}$, which is similar to the memory array A$^{(i)}$ in the block BLOCK$^{(i)}$. A row (e.g., an (m+1)$^{th}$ row) of the memory array A$^{(i+1)}$ is a set of AND memory cells 20 having a common word line (e.g., WL$^{(i+1)}_{m+1}$). The AND memory cells 20 of the memory array A$^{(i+1)}$ in each row (e.g., the (m+1)$^{th}$ row) correspond to a common word line (e.g., WL$^{(i+1)}_{m+1}$) and are coupled to different source pillars (e.g., SP$^{(i+1)}_n$ and SP$^{(i+1)}_{n+1}$) and drain pillars (e.g., DP$^{(i+1)}_n$ and DP$^{(i+1)}_{n+1}$). A column (e.g., an n$^{th}$ column) of the memory array A$^{(i+1)}$ is a set of AND memory cells 20 having a common source pillar (e.g., SP$^{(i+1)}_n$) and a common drain pillar (e.g., DP$^{(i+1)}_n$). The AND memory cells 20 of the memory array A$^{(i+1)}$ in each column (e.g., the n$^{th}$ column) correspond to different word lines (e.g., WL$^{(i+1)}_{m+1}$ and WL$^{(i+1)}_m$) and are coupled to a common source pillar (e.g., SP$^{(i+1)}_n$) and a common drain pillar (e.g., DP$^{(i+1)}_n$). Hence, the AND memory cells 20 of the memory array A$^{(i+1)}$ are logically arranged in a column along the common source pillar (e.g., SP$^{(i+1)}_n$) and the common drain pillar (e.g., DP$^{(i+1)}_n$).

The block BLOCK$^{(i+1)}$ and the block BLOCK$^{(i)}$ share source lines (e.g., SL$_n$ and SL$_{n+1}$) and bit lines (e.g., BL$_n$ and BL$_{n+1}$). Therefore, the source line SL$_n$ and the bit line BL$_n$ are coupled to the n$^{th}$ column of AND memory cells 20 in the AND memory array A$^{(i)}$ of the block BLOCK$^{(i)}$, and are coupled to the n$^{th}$ column of AND memory cells 20 in the AND memory array A$^{(i+1)}$ of the block BLOCK$^{(i+1)}$. Similarly, the source line SL$_{n+1}$ and the bit line BL$_{n+1}$ are coupled to the (n+1)$^{th}$ column of AND memory cells 20 in the AND memory array A$^{(i)}$ of the block BLOCK$^{(i)}$, and are coupled to the (n+1)$^{th}$ column of AND memory cells 20 in the AND memory array A$^{(i+1)}$ of the block BLOCK$^{(i+1)}$.

Referring to FIG. 1B to FIG. 1D, the memory array 10 may be disposed over an interconnect structure of a semiconductor die, for example, being disposed on one or more active devices (e.g., transistors) formed on a semiconductor substrate. Therefore, a dielectric substrate 50 is, for example, a dielectric layer (e.g., a silicon oxide layer) over a metal interconnect structure formed on a silicon substrate. The memory array 10 may include a gate stack structure 52, a plurality of channel pillars 16, a plurality of first conductive pillars (also referred to as source pillars) 32a, a plurality of second conductive pillars (also referred to as drain pillars) 32b, and a plurality of charge storage structures 40.

Referring to FIG. 1B, the gate stack structure 52 is formed on the dielectric substrate 50 in an array region (not shown) and a staircase region (not shown). The gate stack structure 52 includes a plurality of gate layers (also referred to as word lines) 38 and a plurality of insulating layer 54 vertically stacked on a surface 50s of the dielectric substrate 50. In the Z direction, the gate layers 38 are electrically isolated from each other by the insulating layer 54 disposed therebetween. The gate layer 38 extends in a direction parallel to the surface of the dielectric substrate 50. The gate layers 38 in the staircase region may have a staircase structure (not shown). Therefore, a lower gate layer 38 is longer than an upper gate layer 38, and the end of the lower gate layer 38 extends laterally beyond the end of the upper gate layer 38. A contact (not shown) for connecting the gate layer 38 may land on the end of the gate layer 38 to connect the gate layers 38 respectively to conductive lines.

Referring to FIG. 1B to FIG. 1D, the memory array 10 further includes a plurality of channel pillars 16. The channel pillar 16 continuously extends through the gate stack structure 52. In some embodiments, the channel pillar 16 may have a circular profile in a top view. The material of the channel pillar 16 may be semiconductor such as undoped polysilicon.

Referring to FIG. 1B to FIG. 1D, the memory array 10 further includes an insulating pillar 28, a plurality of first conductive pillars 32a, and a plurality of second conductive pillars 32b. In this example, the first conductive pillars 32a serve as source pillars. The second conductive pillars 32b serve as drain pillars. The first conductive pillar 32a, the second conductive pillar 32b, and the insulating pillar 28 each extend in a direction (i.e., the Z direction) perpendicular to the surface (e.g., the XY plane) of the gate layer 38. The first conductive pillar 32a and the second conductive pillar 32b are separated from each other by the insulating pillar 28. The first conductive pillar 32a and the second conductive pillar 32b are electrically connected to the channel pillar 16. The first conductive pillar 32a and the second conductive pillar 32b include doped polysilicon or metal materials. The insulating pillar 28 is, for example, silicon nitride or silicon oxide.

Referring to FIG. 1C and FIG. 1D, the charge storage structure 40 is disposed between the channel pillar 16 and the gate layers 38. The charge storage structure 40 may include a tunneling layer (or referred to as a bandgap engineered tunneling oxide layer) 14, a charge storage layer 12, and a blocking layer 36. The charge storage layer 12 is located between the tunneling layer 14 and the blocking layer 36. In some embodiments, the tunneling layer 14 and the blocking layer 36 include silicon oxide. The charge storage layer 12 includes silicon nitride or other materials capable of trapping charges. In some embodiments, as shown in FIG. 1C, a portion (the tunneling layer 14 and the charge storage layer 12) of the charge storage structure 40 continuously extends in a direction (i.e., the Z direction) perpendicular to the gate layer 38, and the other portion (the blocking layer 36) of the charge storage structure 40 surrounds the gate layer 38. In other embodiments, as shown in FIG. 1D, the charge storage structure 40 (the tunneling layer 14, the charge storage layer 12, and the blocking layer 36) surrounds the gate layer 38.

Referring to FIG. 1E, the charge storage structure 40, the channel pillar 16, the source pillar 32a, and the drain pillar 32b are surrounded by the gate layer 38, and a memory cell 20 is defined. According to different operation methods, a 1-bit operation or a 2-bit operation may be performed on the memory cell 20. For example, when a voltage is applied to the source pillar 32a and the drain pillar 32b, since the source pillar 32a and the drain pillar 32b are connected to the channel pillar 16, electrons may be transferred along the channel pillar 16 and stored in the entire charge storage structure 40. Accordingly, a 1-bit operation may be performed on the memory cell 20. In addition, for an operation involving Fowler-Nordheim tunneling, electrons or holes may be trapped in the charge storage structure 40 between the source pillar 32a and the drain pillar 32b. For an operation involving source side injection, channel-hot-electron injection, or band-to-band tunneling hot carrier injection, electrons or holes may be locally trapped in the charge storage structure 40 adjacent to one of the source pillar 32a and the drain pillar 32b. Accordingly, a single level cell (SLC, 1 bit) or multi-level cell (MLC, greater than or equal to 2 bits) operation may be performed on the memory cell 20.

During operation, a voltage is applied to a selected word line (gate layer) 38; for example, when a voltage higher than a corresponding threshold voltage ($V_{th}$) of the corresponding memory cell 20 is applied, a channel region of the channel pillar 16 intersecting the selected word line 38 is turned on to allow a current to enter the drain pillar 32b from the bit line $BL_n$ or $BL_{n+1}$ (shown in FIG. 1i), flow to the source pillar 32a via the turned-on channel region (e.g., in a direction indicated by arrow 60), and finally flow to the source line $SL_n$ or $SL_{n+1}$ (shown in FIG. 1B).

Referring to FIG. 1B to FIG. 1E, in some embodiments of the disclosure, the source pillar 32a and the drain pillar 32b each include a metal silicide pillar, a metal pillar, a barrier layer, and a metal layer, and the fabrication method thereof may be described in detail with reference to FIG. 2A to FIG. 2L and FIG. 3A to FIG. 3L. In other embodiments, the source pillar 32a and the drain pillar 32b each include a metal silicide pillar and a metal layer, but do not include a metal pillar and a barrier layer, and the fabrication method thereof may be described in detail with reference to FIG. 4A to FIG. 4F and FIG. 5A to FIG. 5F. In FIG. 1B and FIG. 1E, the source pillar 32a and the drain pillar 32b are only shown in circular profiles. However, the shapes and profiles of the source pillar and the drain pillar may be as shown in FIG. 3L and FIG. 5F, but are not limited thereto.

FIG. 2A to FIG. 2L are schematic cross-sectional views of a process of fabricating a three-dimensional AND flash memory device according to an embodiment of the disclosure. FIG. 3A to FIG. 3L show top views of line III-III' of FIG. 2A to FIG. 2L.

Figure 2A:
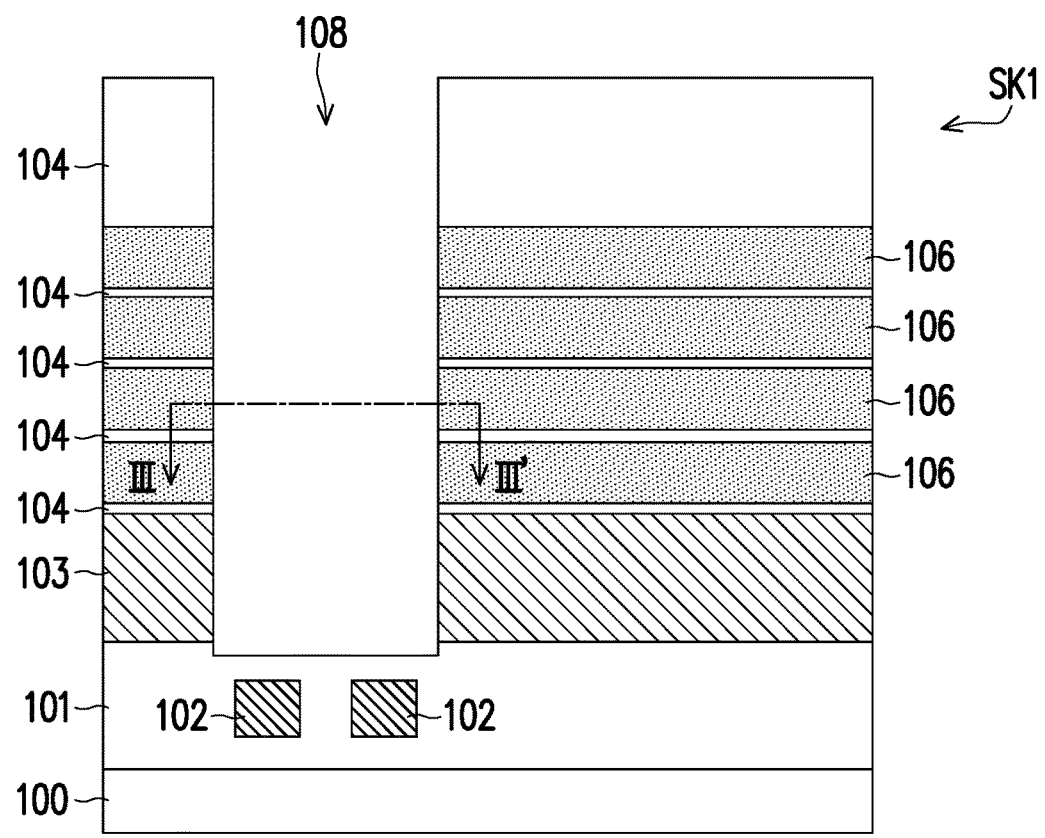
FIG. 2A to FIG. 2L are schematic cross-sectional views of a process of fabricating a three-dimensional AND flash memory device according to an embodiment of the disclosure.

Referring to FIG. 2A, a dielectric substrate 100 is provided. The dielectric substrate 100 is, for example, a dielectric layer (e.g., a silicon oxide layer) over a metal interconnect structure formed on a silicon substrate. The dielectric substrate 100 includes an array region and a staircase region. A stack structure SK1 is formed on the dielectric substrate 100 in the array region and the staircase region. The stack structure SK1 may also be referred to as an insulating stack structure SK1. In this embodiment, the stack structure SK1 is composed of insulating layers 104 and intermediate layers 106 that are sequentially alternately stacked on the dielectric substrate 100. In other embodiments, the stack structure SK1 may be composed of intermediate layers 106 and insulating layers 104 that are sequentially alternately stacked on the dielectric substrate 100. In addition, in this embodiment, the uppermost layer of the stack structure SK1 is the insulating layer 104. The insulating layer 104 is, for example, a silicon oxide layer. The intermediate layer 106 is, for example, a silicon nitride layer. The intermediate layer 106 may serve as a sacrificial layer which may be partially removed in the subsequent process. In this embodiment, the stack structure SK1 has five insulating layers 104 and four intermediate layers 106, but the disclosure is not limited thereto. In other embodiments, more insulating layers 104 and more intermediate layers 106 may be formed according to the actual requirements.

In some embodiments, before the stack structure SK1 is formed, an insulating layer 101, a stop layer 102, and a conductive layer 103 are first formed on the dielectric substrate 100. The insulating layer 101 is, for example, silicon oxide. The stop layer 102 is formed in the insulating layer 101. The stop layer 102 is, for example, a conductive pattern such as a polysilicon pattern. The conductive layer 103 is, for example, a grounded polysilicon layer. The conductive layer 103 may also be referred to as a dummy gate, which may be used to close a leakage path. The stack structure SK1 is patterned to form a staircase structure in the staircase region.

Figure 3A:
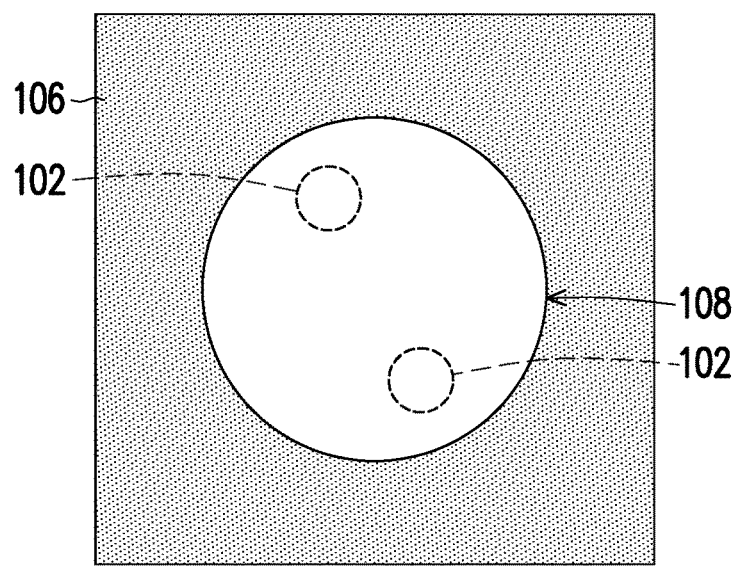
FIG. 3A to FIG. 3L show top views of line III-III' of FIG. 2C to FIG. 2L.

Next, referring to FIG. 2A and FIG. 3A, a plurality of openings 108 are formed in the stack structure SK1 in the array region. In this embodiment, the opening 108 extends through the conductive layer 103, and the bottom surface of the opening 108 does not expose the stop layer 102 and the insulating layer 101, but the disclosure is not limited thereto. In this embodiment, in a top view, the opening 108 has a circular profile, but the disclosure is not limited thereto. In other embodiments, the opening 108 may have a profile of other shapes such as a polygonal shape (not shown).

Figure 2B:
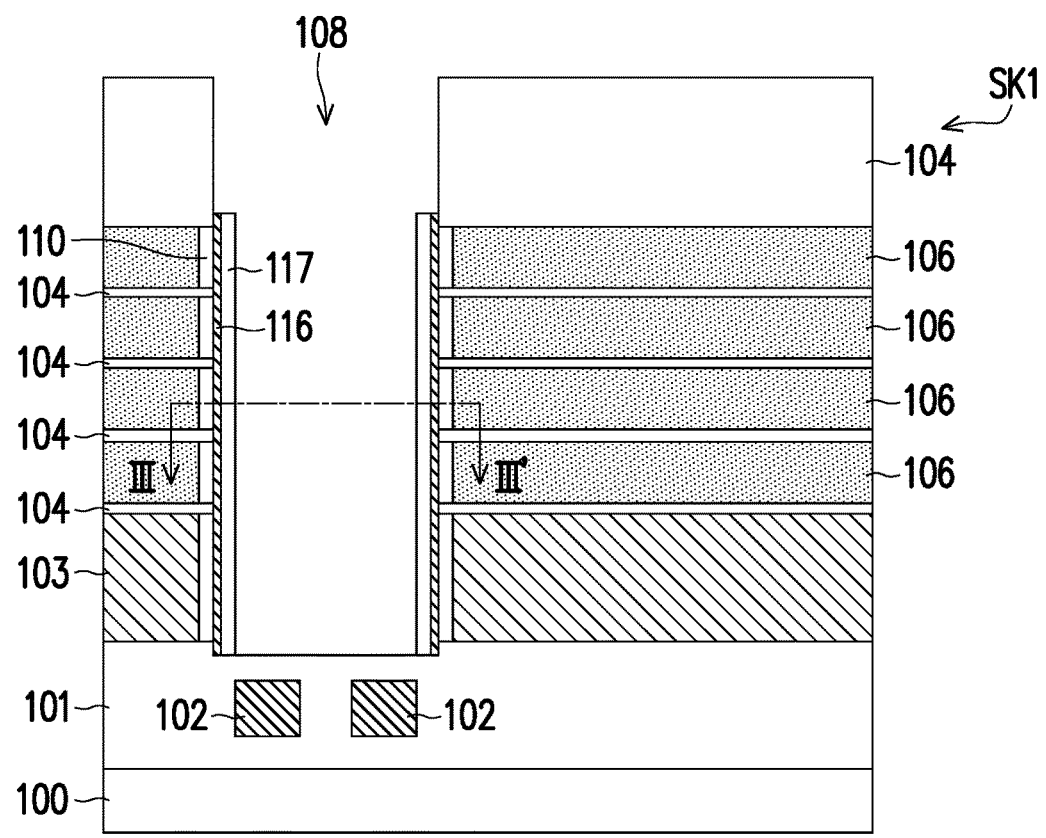
Figure 3B:
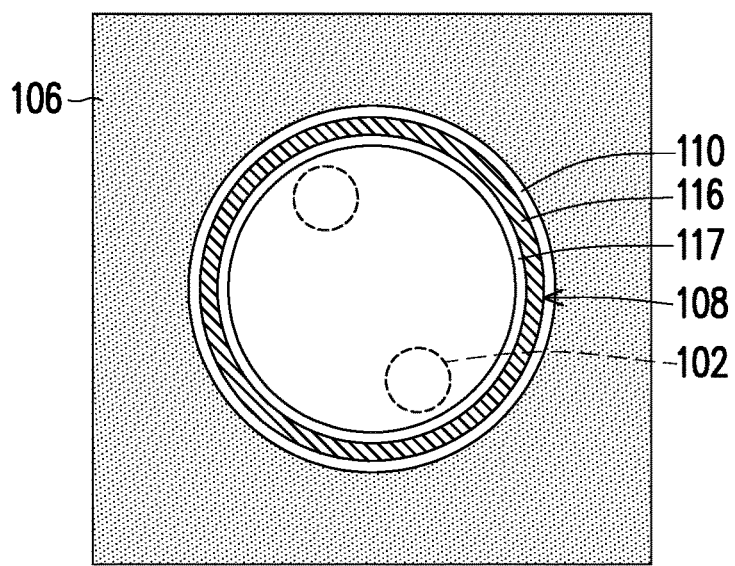

Referring to FIG. 2B and FIG. 3B, a protection layer 110, a channel pillar 116, and a spacer 117 are formed in the opening 108. The protection layer 110 is formed on the sidewall of the intermediate layer 106. The protection layer 110 is, for example, a silicon oxide layer. The material of the channel pillar 116 may be semiconductor such as undoped polysilicon. The spacer 117 is, for example, a low-temperature silicon oxide layer. The method of forming the protection layer 110 is, for example, thermal oxidation. The method of forming the channel pillar 116 and the spacer 117 includes, for example, forming a channel material layer and a spacer material layer on the stack structure SK1 and in the opening 108. Then, an etch-back process is performed to partially remove the channel material layer and the spacer material layer to form the channel pillar 116 and the spacer 117. The channel pillar 116 and the spacer 117 cover the sidewall of the opening 108 and expose the bottom of the opening 108. The channel pillar 116 and the spacer 117 may extend through the stack structure SK1 and extend into the insulating layer 101 but are not limited thereto. In a top view, the channel pillar 116 has, for example, a ring shape, and the channel pillar 116 may be continuous in its extending direction (e.g., in a direction perpendicular to the dielectric substrate 100). In other words, the channel pillar 116 is integral in its extending direction and is not divided into multiple disconnected parts. In some embodiments, the channel pillar 116 may have a circular profile in a top view, but the disclosure is not limited thereto. In other embodiments, the channel pillar 116 may also have a profile of other shapes (e.g., a polygonal shape) in a top view. The protection layer 110 and the spacer 117 are respectively located on two sidewalls of the channel pillar 116.

Figure 2C:
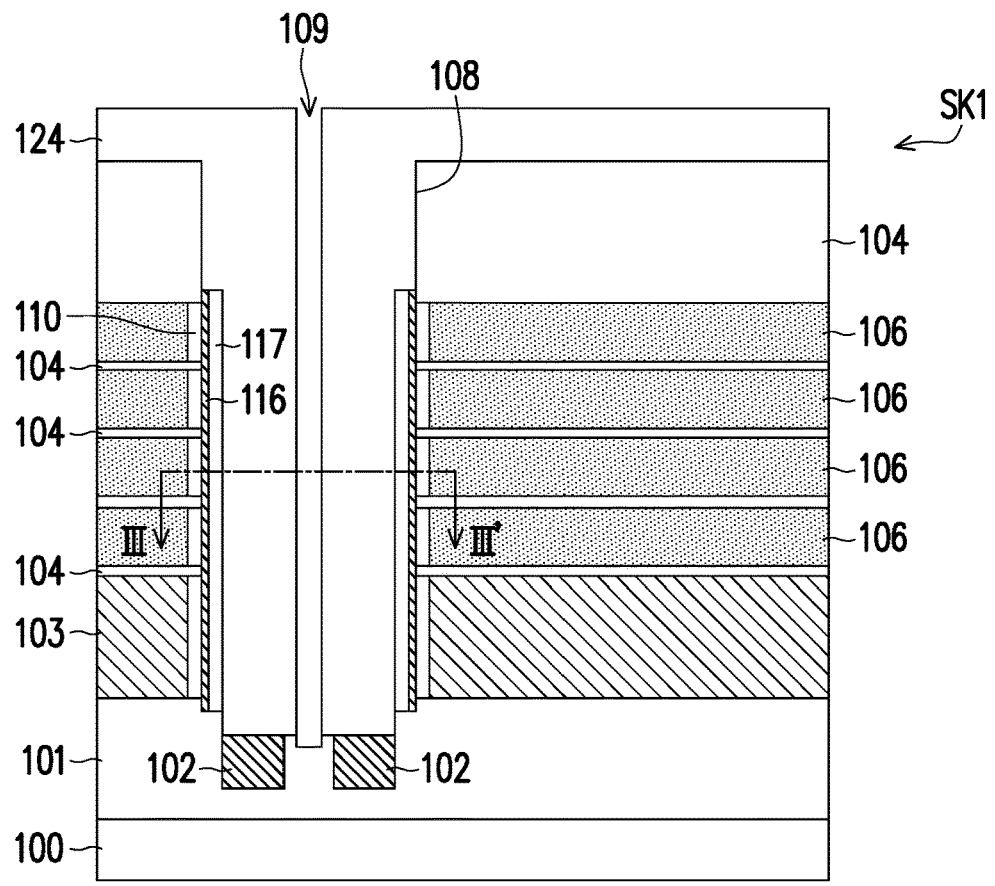
Figure 3C:
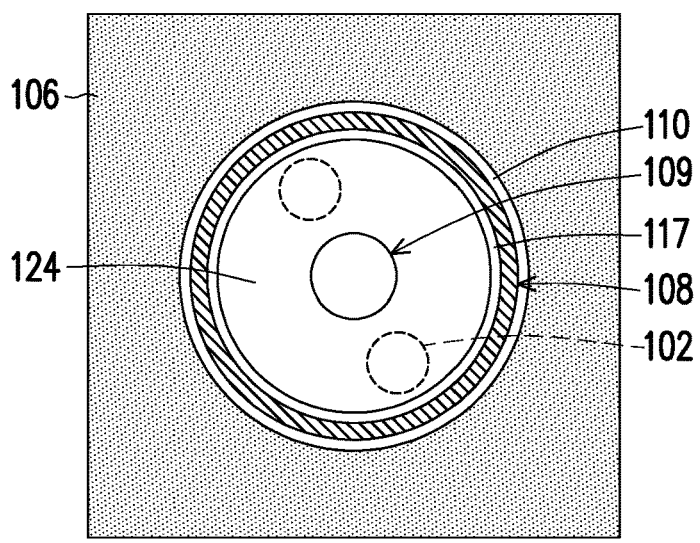

Referring to FIG. 2C and FIG. 3C, an insulating filling material is formed on the stack structure SK1 and filled in the opening 108. The insulating filling material is, for example, a low-temperature silicon oxide. The insulating filling material filled in the opening 108 forms an insulating filling layer 124, and a circular seam is left at the center of the insulating filling layer 124. Then, an anisotropic etching process is performed to expand the circular seam to form a hole 109. In this embodiment, the hole 109 extends through the conductive layer 103, and the bottom surface of the hole 109 is located between the top surface and the bottom surface of the stop layer 102, but the disclosure is not limited thereto.

Figure 2D:
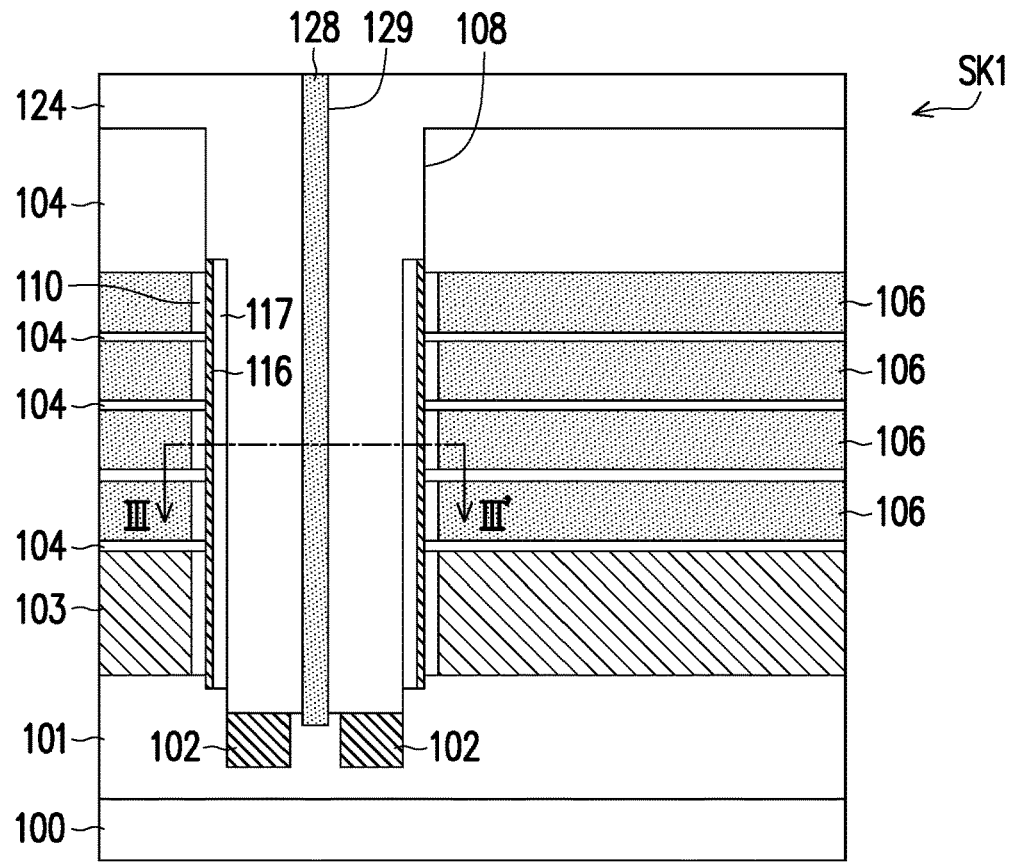
Figure 3D:
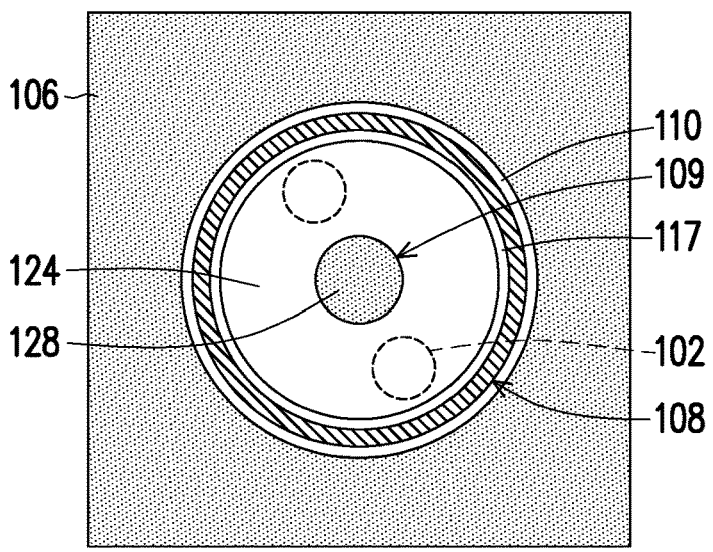

Referring to FIG. 2D and FIG. 3D, an insulating material layer is formed on the insulating filling layer 124 and in the hole 109. Then, an anisotropic etching process is performed to remove part of the insulating material layer to form an insulating pillar 128 in the hole 109. The material of the insulating pillar 128 is different from the material of the insulating filling layer 124. The material of the insulating pillar 128 is, for example, silicon nitride.

Figure 2E:
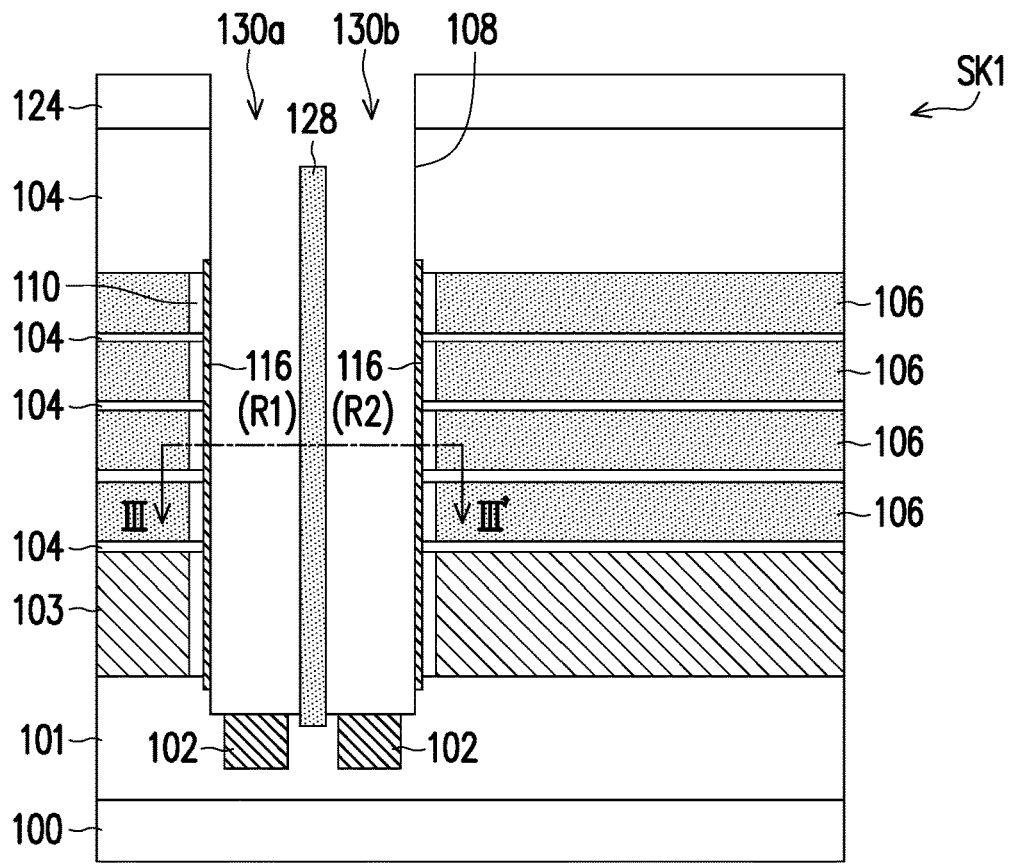
Figure 3E:
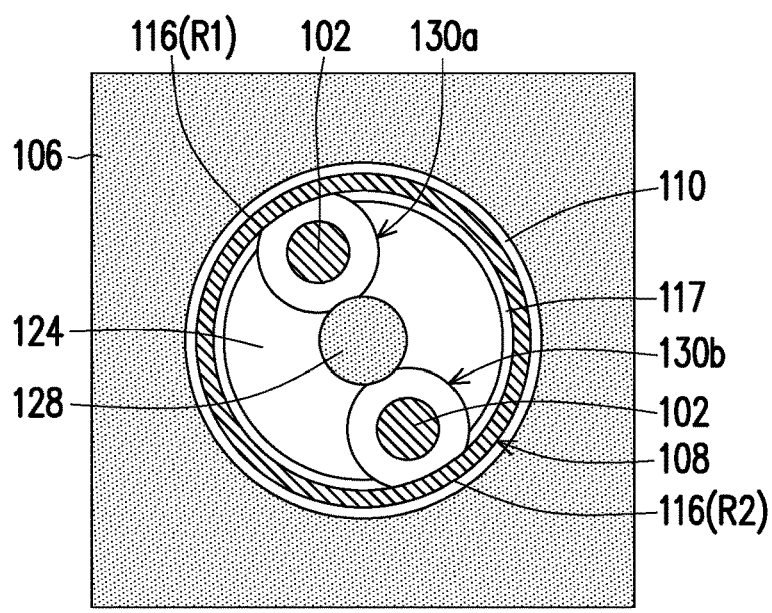

Referring to FIG. 2E and FIG. 3E, a patterning process (e.g., photolithography and etching processes) is performed to form holes 130a and 130b in the insulating filling layer 124. In the etching process, the stop layer 102 may serve as an etch stop layer. Therefore, the formed holes 130a and 130b extend from the stack structure SK1 until the stop layer 102 is exposed. The profiles of the hole patterns defined in the patterning process may be tangent to the profile of the insulating pillar 128. The profiles of the hole patterns defined in the patterning process may also exceed the profile of the insulating pillar 128. Since the etching rate of the insulating pillar 128 is lower than the etching rate of the insulating filling layer 124, the insulating pillar 128 is hardly damaged by etching and remains. In addition, in some embodiments, the profiles of the hole patterns defined in the patterning process exceed the profile of the opening 108, so that the upper sidewalls of the holes 130a and 130b expose part of the top insulating layer 104 of the stack structure SK1. The middle sidewalls and the lower sidewalls of the holes 130a and 130b expose the insulating layer 101, the insulating pillar 128, and the spacer 117.

Next, an etch-back process is performed to remove the spacer 117 exposed on the sidewalls of the holes 130a and 130b to expose a first region R1 and a second region R2 of the channel pillar 116. In this embodiment, metal silicide pillars will be formed on the first region R1 and the second region R2 of the channel pillar 116 through a self-aligned metal silicidation process. If the thickness of the channel pillar 116 is insufficient, it is likely that all or most of the silicon in the first region R1 and the second region R2 would undergo reaction and form metal silicide. Therefore, in this embodiment, additional pillars 119a and 119b are further formed to provide silicon sources for the self-aligned metal silicidation process, as shown in FIG. 2F and FIG. 3F.

Figure 2F:
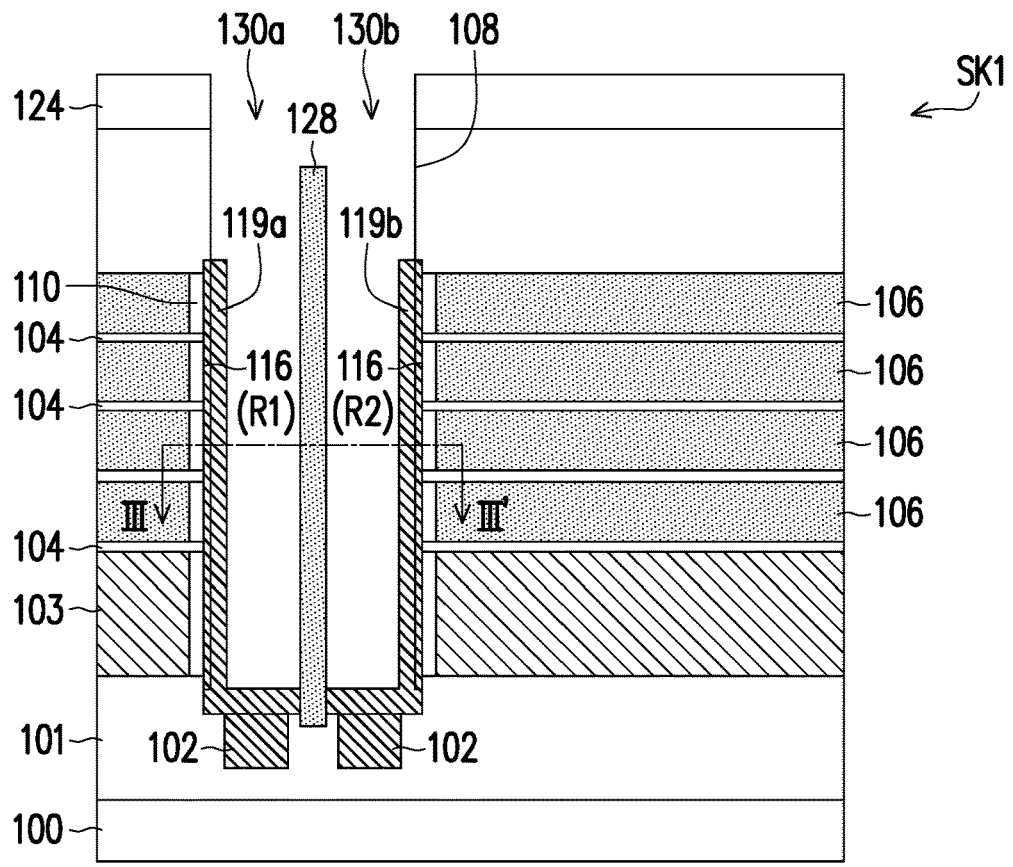
Figure 3F:
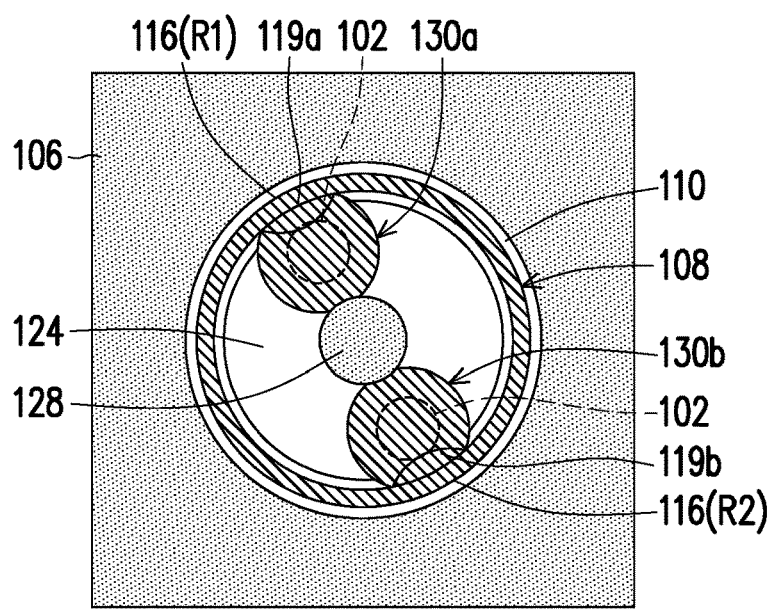

Referring to FIG. 2F and FIG. 3F, additional pillars 119a and 119b are formed on the first region R1 and the second region R2 of the channel pillar 116 and the stop layer 102. With the formation of the additional pillars 119a and 119b, the thickness of silicon in the first region R1 and the second region R2 can be increased. The additional pillars 119a and 119b are, for example, epitaxial silicon layers, and the formation method thereof includes, for example, growing epitaxial layers by the epitaxial growth method respectively from the first region R1 and the second region R2 of the channel pillar 116 and the stop layer 102 until they are connected to each other. In some embodiments, the additional pillars 119a and 119b continuously extend from the first region R1 and the second region R2 of the channel pillar 116 to the stop layer 102. The additional pillars 119a and 119b of this embodiment are, for example, conformal layers and respectively cover the first region R1 and the second region R2 of the channel pillar 116 and the stop layer 102 without filling up the holes 130a and 130b.

Figure 2G:
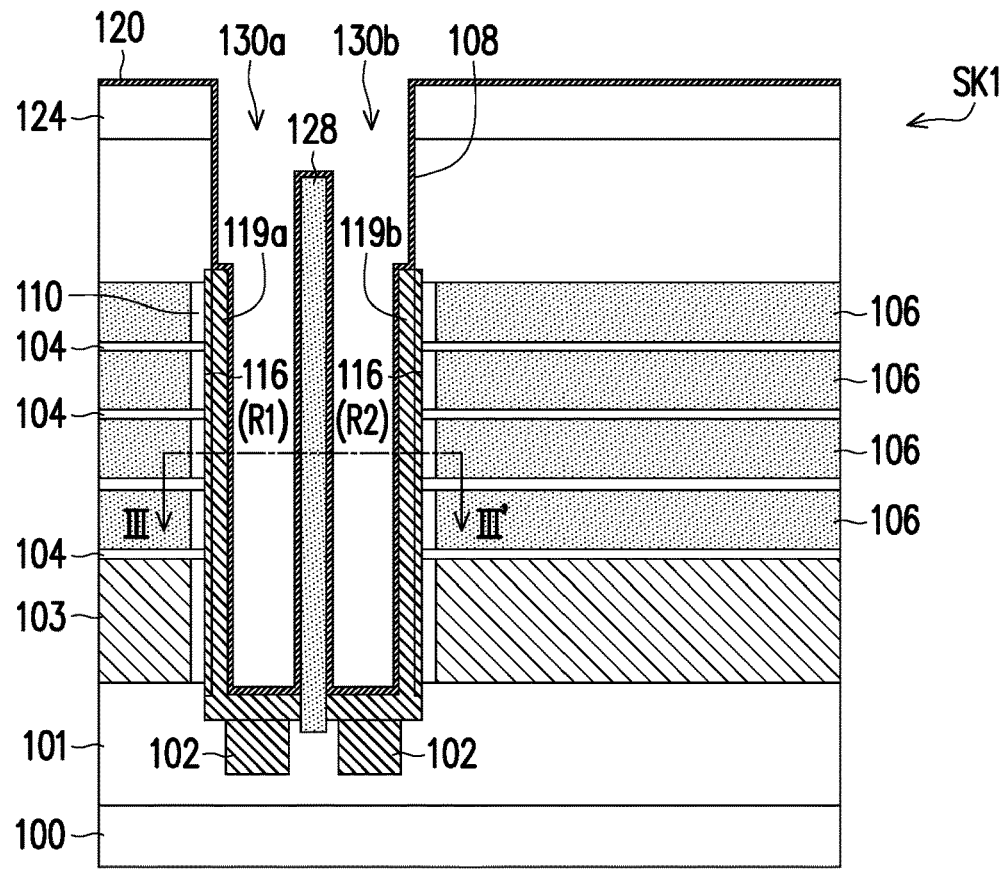
Figure 3G:
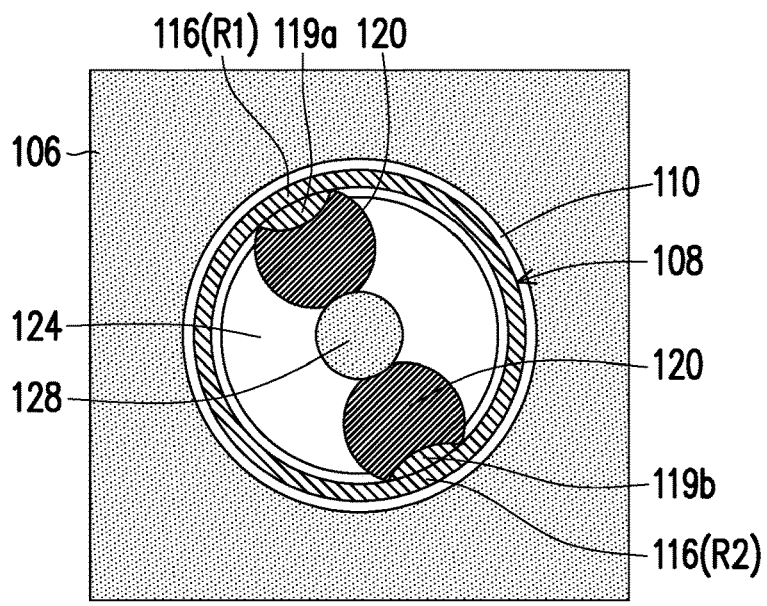

Referring to FIG. 2G and FIG. 3G, afterwards, a self-aligned metallization process is performed. First, a metal layer 120 is formed on the stack structure SK1 and in the holes 130a and 130b. The metal layer 120 covers the top surface and the sidewall of the stack structure SK1, the surfaces of the additional pillars 119a and 119b, and the top surface and the sidewall of the insulating pillar 128. The metal layer 120 is, for example, titanium, cobalt, nickel, platinum, or a combination thereof. The metal layer 120 is formed by, for example, the atomic layer deposition method, and the reacting gas source is, for example, $TiCl_4$.

Figure 2H:
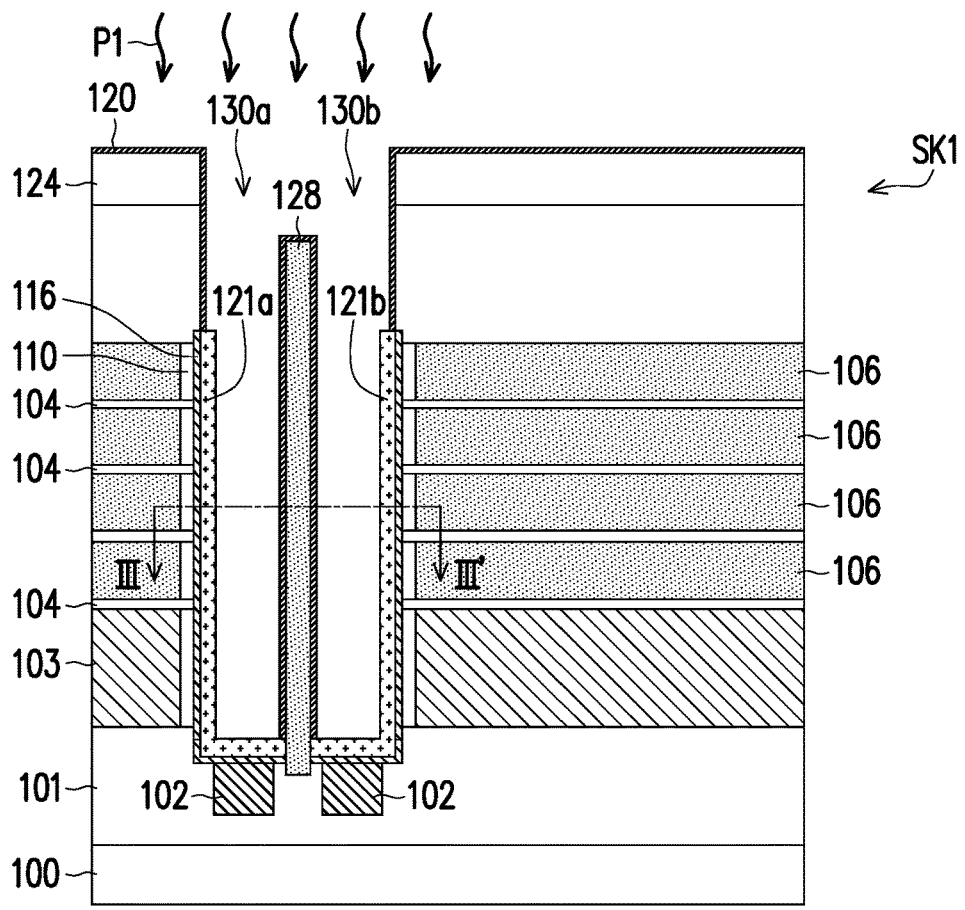
Figure 3H:
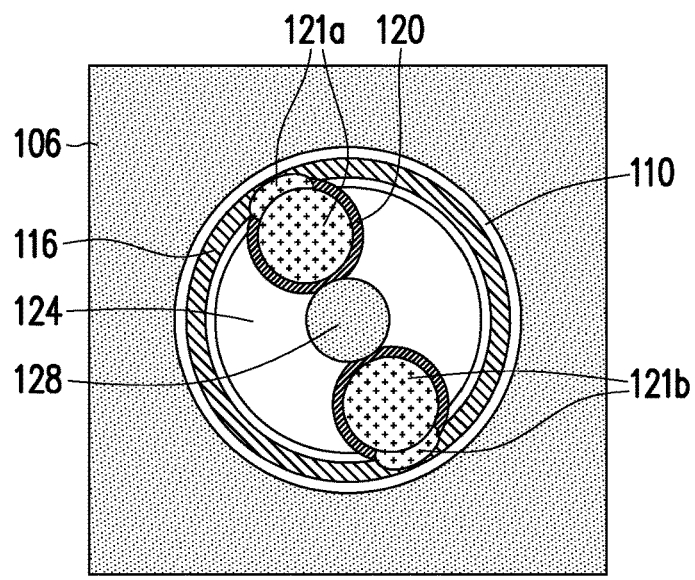

Referring to FIG. 2H and FIG. 3H, then, a thermal process P1 such as rapid thermal processing (RTP) is performed, so that the metal layer 120 reacts with the additional pillars 119a and 119b to form metal silicide pillars 121a and 121b. The material of the metal silicide pillars 121a and 121b is, for example, titanium silicide ($TiSi_2$), cobalt silicide, nickel silicide, platinum silicide, or a combination thereof.

Figure 2I:
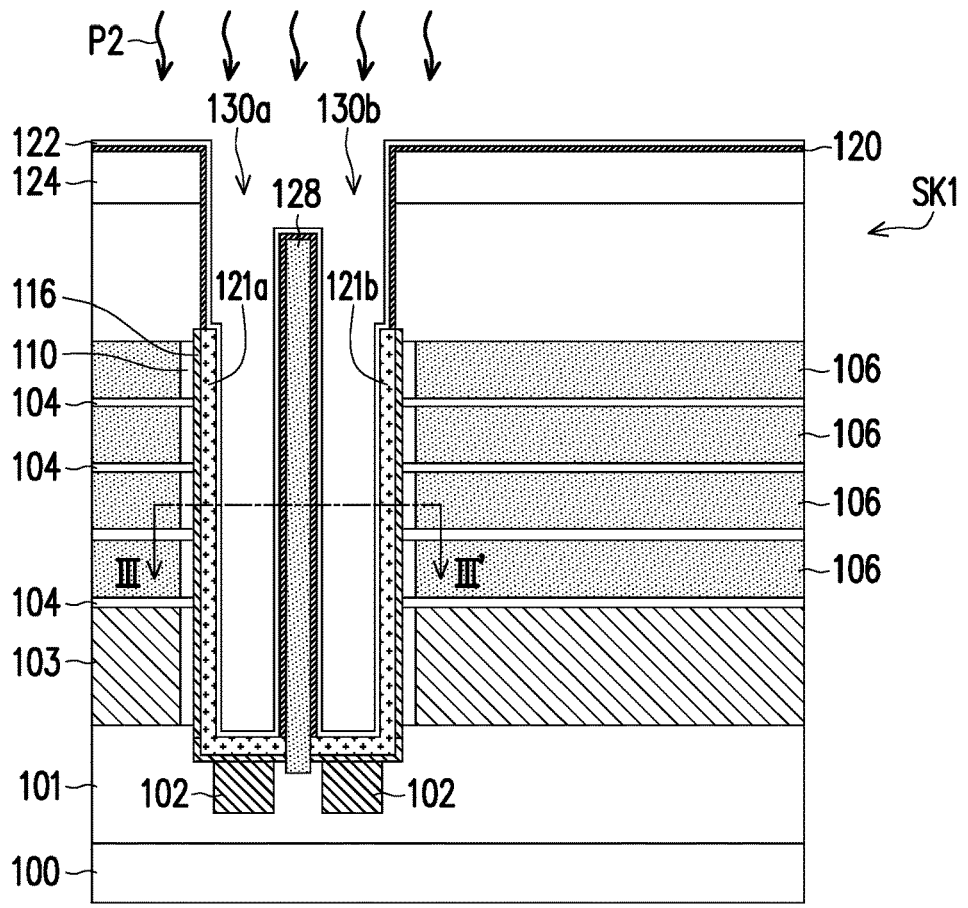
Figure 3I:
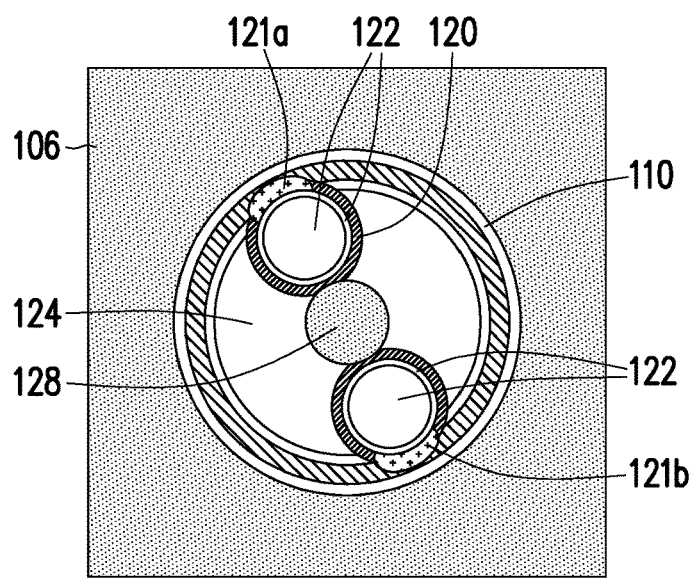

Referring to FIG. 2I and FIG. 3I, a barrier layer 122 is formed on the stack structure SK1 and in the holes 130a and 130b. The barrier layer 122 may also be referred to as an adhesion layer. The material of the barrier layer 122 includes metal nitride such as titanium nitride, cobalt nitride, nickel nitride, platinum nitride, or a combination thereof. The barrier layer 122 is formed by, for example, performing a surface treatment process P2 on the metal layer 120 and the metal silicide pillars 121a and 121b. The surface treatment process P2 is, for example, a nitridation process, so that the surfaces of the metal layer 120 and the metal silicide pillars 121a and 121b are nitrided to form metal nitride. The nitridation process is, for example, a plasma process or an ion implantation process. The gas used in the nitridation process includes, for example, nitrogen or ammonia.

Figure 2J:
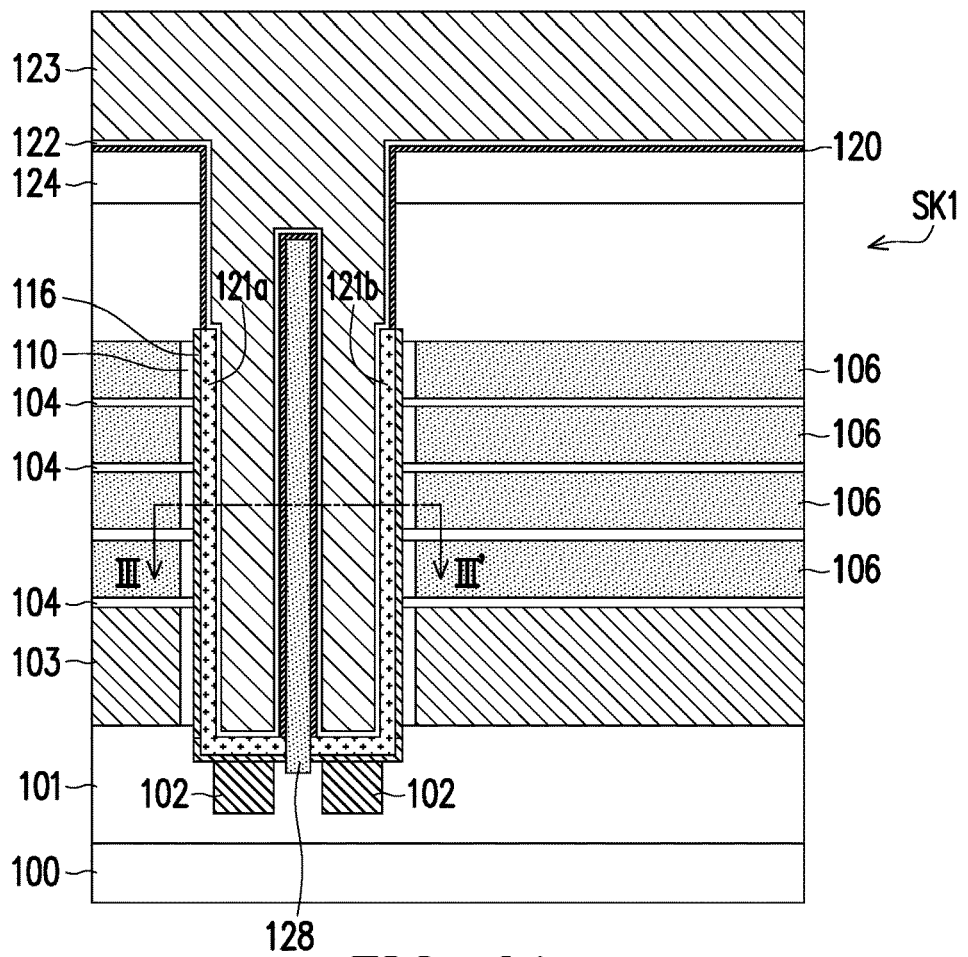
Figure 3J:
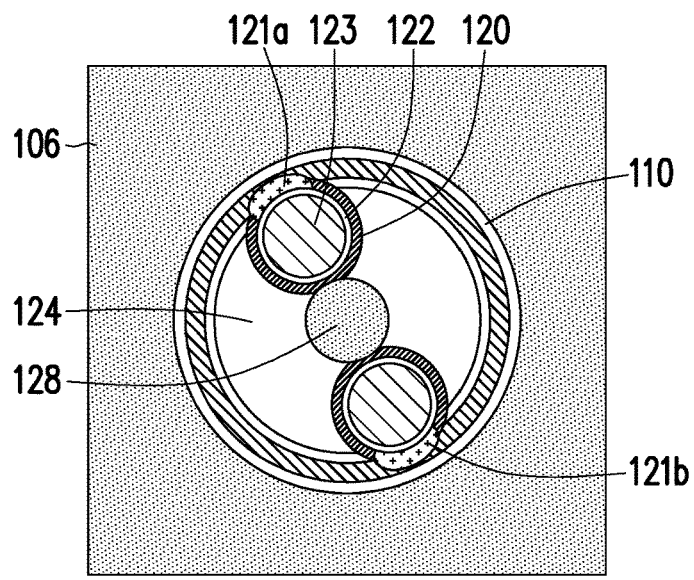

Referring to FIG. 2J and FIG. 3J, a metal layer 123 is formed on the barrier layer 122 and fills up the holes 130a and 130b. The metal layer 123 is, for example, tungsten or a tungsten alloy.

Figure 2K:
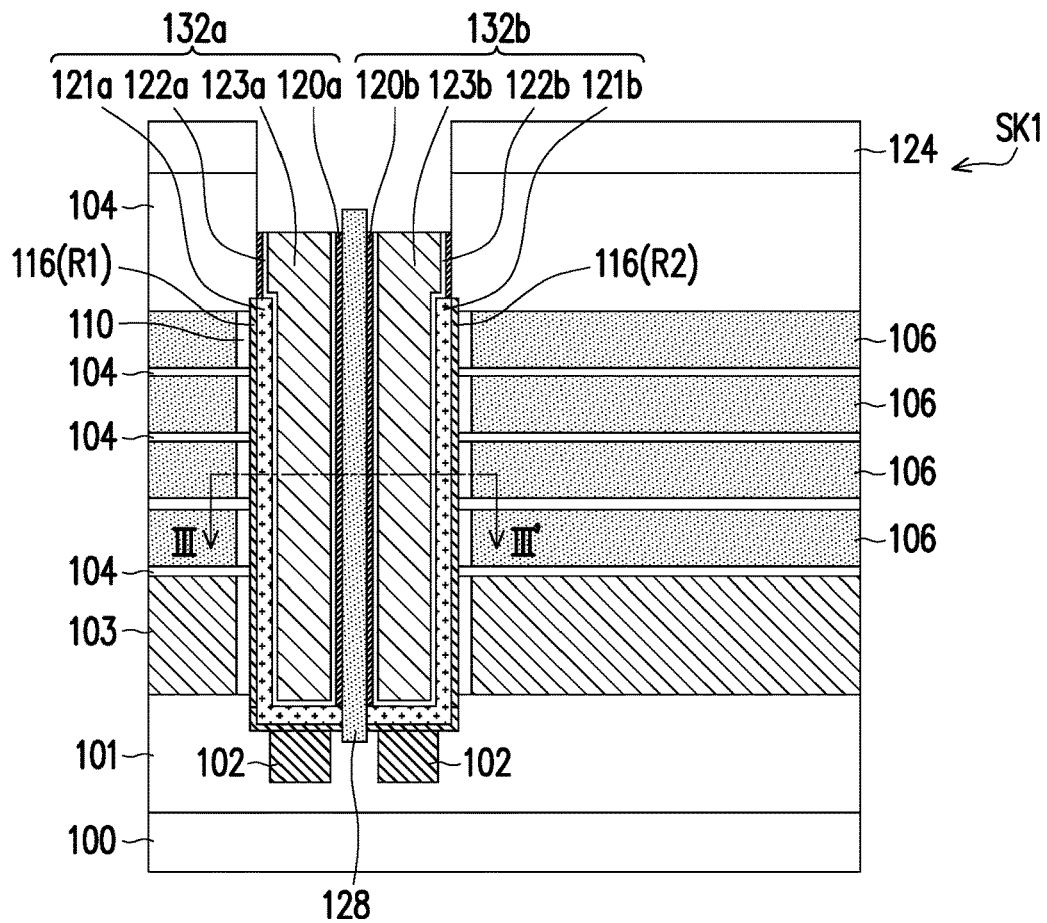
Figure 3K:
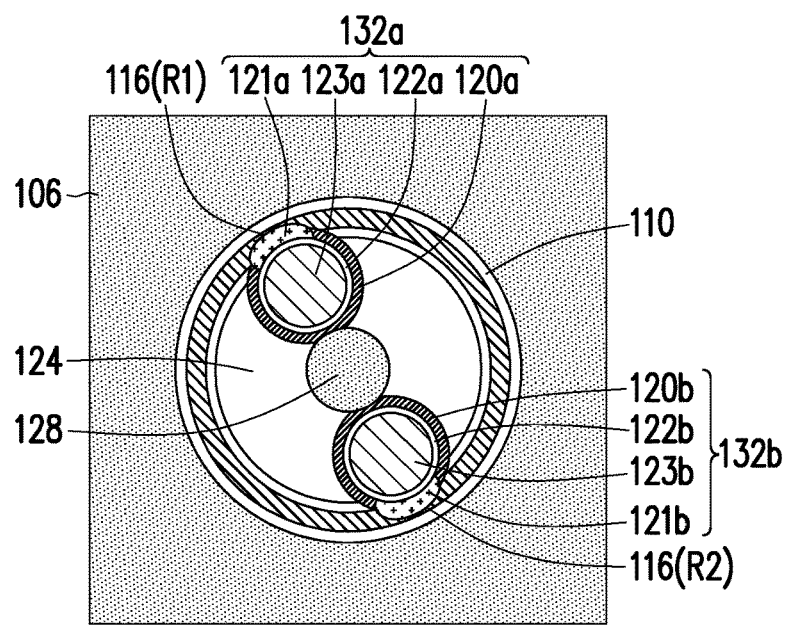
Figure 2L:
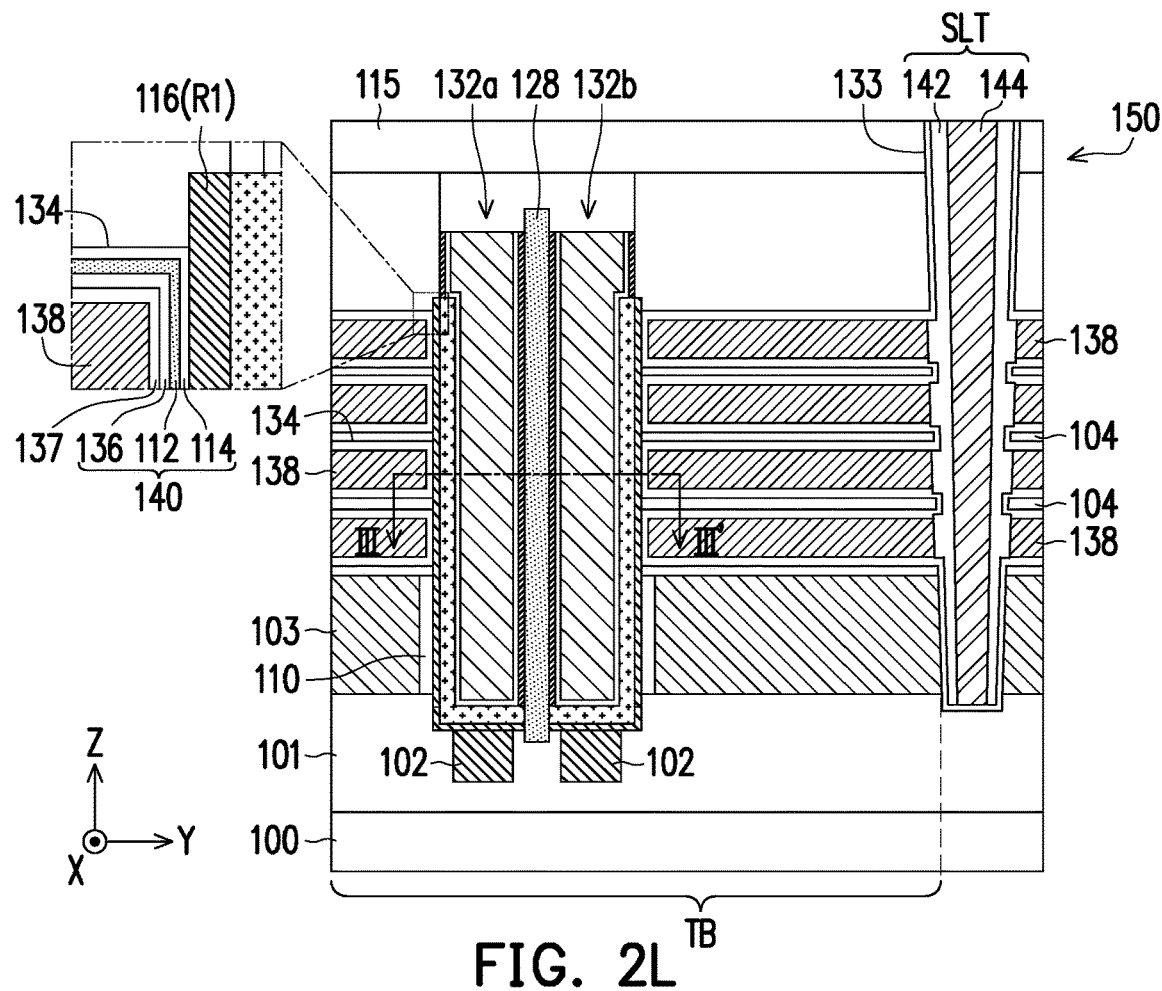
Figure 3L:
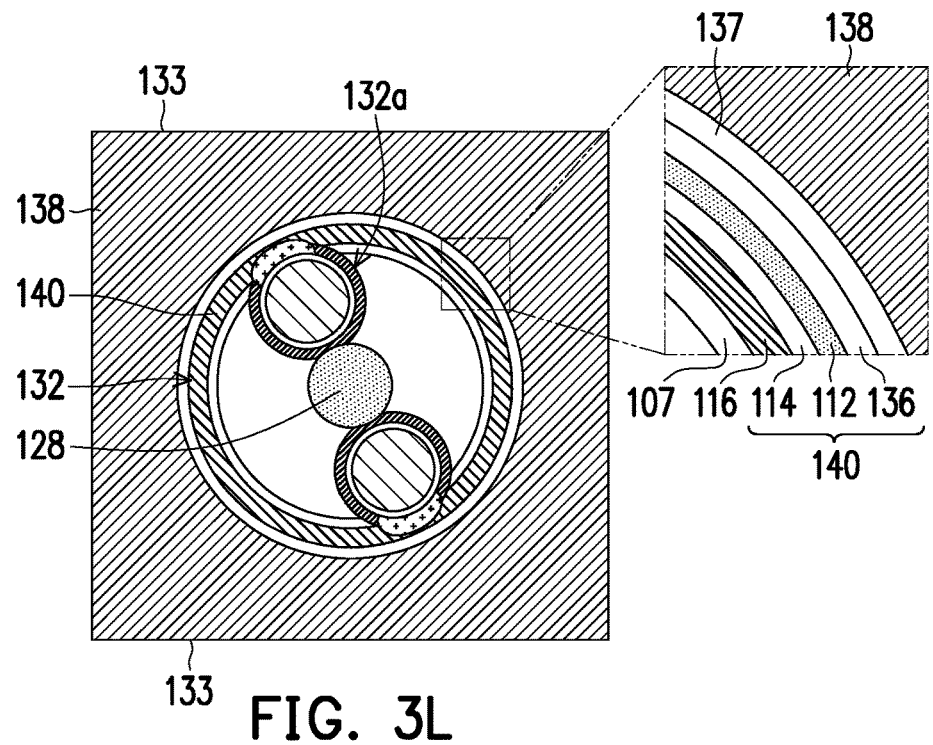

Referring to FIG. 2K and FIG. 3K, an etch-back process is performed on the metal layer 123, the barrier layer 122, and the unreacted metal layer 120 to form a metal pillar 123a, a barrier layer 122a, and a metal layer 120a in the hole 130a, and form a metal pillar 123b, a barrier layer 122b, and a metal layer 120b in the hole 130b. The metal layer 120a, the metal silicide pillar 121a, the barrier layer 122a, and the metal pillar 123a may be collectively referred to as a conductive pillar 132a. The metal layer 120b, the metal silicide pillar 121b, the barrier layer 122b, and the metal pillar 123b may be collectively referred to as a conductive pillar 132b. The conductive pillar 132a and the conductive pillar 132b may serve as a source pillar and a drain pillar, and are respectively electrically connected to the first region R1 and the second region R2 of the channel pillar 116. The conductive pillar 132a and the conductive pillar 132b are separated from each other by the insulating pillar 128.

In this embodiment, the metal pillars 123a and 123b are solid pillars, e.g., circular solid pillars. The barrier layers 122a and 122b surround the sidewalls and bottoms of the metal pillars 123a and 123b. The metal silicide pillars 121a and 121b extend toward each other and protrude from the inner sidewall of the channel pillar 116, are electrically connected to the first region R1 and the second region R2 of the channel pillar 116, cover a portion of the sidewalls and bottoms of the barrier layers 122a and 122b, and are separated by the insulating pillar 128. The material of the metal layers 120a and 120b is different from the material of the metal pillars 123a and 123b, and includes the same metal element as the metal silicide pillars 121a and 121b. The metal layer 120a is located between the barrier layer 122a and the insulating filling layer 124, and is connected with the metal silicide pillar 121a to surround the metal pillar 123a together with the metal silicide pillar 121a. The metal layer 120b is located between the barrier layer 122b and the insulating filling layer 124 is connected with the metal silicide pillar 121b to surround the metal pillar 123b together with the metal silicide pillar 121b. The metal layers 120a and 120b surround and cover another portion of the sidewalls of the barrier layers 122a and 122b, and are separated by the insulating pillar 128. The resistances of the metal silicide pillars 121a and 121b are less than the resistance of the channel pillar 116, and the resistances of the metal silicide pillars 121a and 121b are between the resistance of the channel pillar 116 and the resistances of the metal pillars 123a and 123b. The volumes of the metal silicide pillars 121a and 121b are respectively equal to or smaller than the volumes of the metal pillars 123a and 123b but are not limited thereto.

Next, referring to FIG. 2L to FIG. 3L, a cap insulating layer 115 is formed on the stack structure SK1. Afterwards, a replacement process is performed to replace the intermediate layers 106 with a plurality of gate layers 138. First, a patterning process (e.g., photolithography and etching processes) is performed on the stack structure SK1 to form a plurality of slit trenches 133. In the etching process, the insulating layer 101 or the conductive layer 103 may serve as an etch stop layer, so that the slit trench 133 exposes the insulating layer 101 or the conductive layer 103. The slit trench 133 extends along the X direction, so that the stack structure SK1 in the array region and the staircase region is divided into a plurality of blocks TB.

Next, an etching process such as a wet etching process is performed to remove part of the intermediate layers 106. An etching solution (e.g., hot phosphoric acid) used in the etching process is injected into the slit trenches 133, and then the contacted portion of the intermediate layers 106 is removed. When the intermediate layers 106 between the channel pillar 116 and the slit trench 133 are removed, since the material of the protection layer 110 is different from the material of the intermediate layer 106, the protection layer 110 may serve as an etch stop layer to protect the channel pillar 116. The etching process is continued, and through time mode control, most of the intermediate layers 106 are removed to form a plurality of horizontal openings 134. Then, the protection layer 110 is removed.

A plurality of tunneling layers 114, a plurality of charge storage layers 112, a plurality of blocking layers 136, and a plurality of gate layers 138 are formed in the horizontal openings 134. The material of the tunneling layer 114 is, for example, silicon oxide. The material of the charge storage layer 112 is, for example, silicon nitride. The material of the blocking layer 136 is, for example, a high dielectric constant material having a dielectric constant greater than or equal to 7, such as aluminum oxide ($Al_1O_3$), hafnium oxide ($HfO_2$), lanthanum oxide ($La_2O_5$), transition metal oxide, lanthanide oxide, or combinations thereof. The material of the gate layer 138 is, for example, tungsten. In some embodiments, before the gate layers 138 are formed, a barrier layers 137 is formed. The material of the barrier layer 137 is, for example, titanium (Ti), titanium nitride (TiN), tantalum (Ta), tantalum nitride (TaN), or a combination thereof.

The method of forming the tunneling layer 114, the charge storage layer 112, the blocking layer 136, the barrier layer 137, and the gate layer 138 includes, for example, sequentially forming a tunneling material layer, a storage material layer, a blocking material layer, a barrier material layer, and a conductive material layer in the slit trench 133 and the horizontal opening 134. Then, an etch-back process is performed to remove the tunneling material layer, the storage material layer, the blocking material layer, the barrier material layer, and the conductive material layer in the slit trenches 133 to form the tunneling layer 114, the charge storage layer 112, the blocking layer 136, the barrier layer 137, and the gate layer 138 in the horizontal openings 134. The tunneling layer 114, the charge storage layer 112, and the blocking layer 136 are collectively referred to as a charge storage structure 140. At this time, a gate stack structure 150 is formed. The gate stack structure 150 is disposed on the dielectric substrate 100 and includes a plurality of gate layers 138 and a plurality of insulating layers 104 stacked alternately with each other.

A slit SLT is formed in the slit trench 133. The method of forming the slit SLT includes filling an insulating liner material and a conductive material on the gate stack structure 150 and in the slit trench 133. The insulating material is, for example, silicon oxide. The conductive material is, for example, polysilicon. Then, the excessive insulating liner material and conductive material on the gate stack structure 150 is removed through an etch-back process or a planarization process to form a liner layer 142 and a conductive layer 144. The liner layer 142 and the conductive layer 144 are collectively referred to as a slit SLT. In other embodiments, the slit SLT may also be fully filled with an insulating material without any conductive layer. In still other embodiments, the slit SLT may also be a liner layer 142, and the liner layer 142 covers an air gap without any conductive layer.

Afterwards, a contact (not shown) is formed in the staircase region. The contact lands on the end of the gate layer 138 in the staircase region and is electrically connected thereto.

In the above embodiment with reference to FIG. 2A to FIG. 2K and FIG. 3A to FIG. 3K, the metal silicide pillar, the barrier layer, the metal pillar, and the metal layer are used as the source pillar and the drain pillar. In other embodiments, the metal pillar and the barrier layer are omitted from the source pillar and the drain pillar, as shown in FIG. 4A to FIG. 4F and FIG. 5A to FIG. 5F.

Figure 4A:
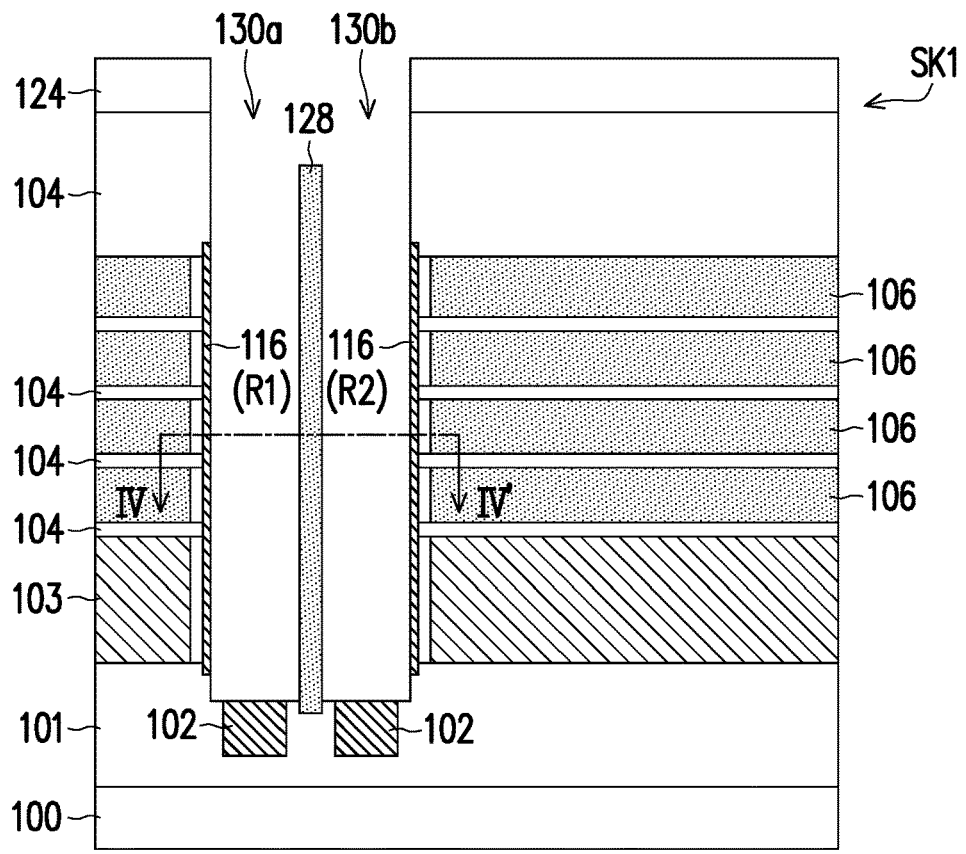
FIG. 4A to FIG. 4F are schematic cross-sectional views of a process of fabricating another three-dimensional AND flash memory device according to an embodiment of the disclosure.
Figure 5A:
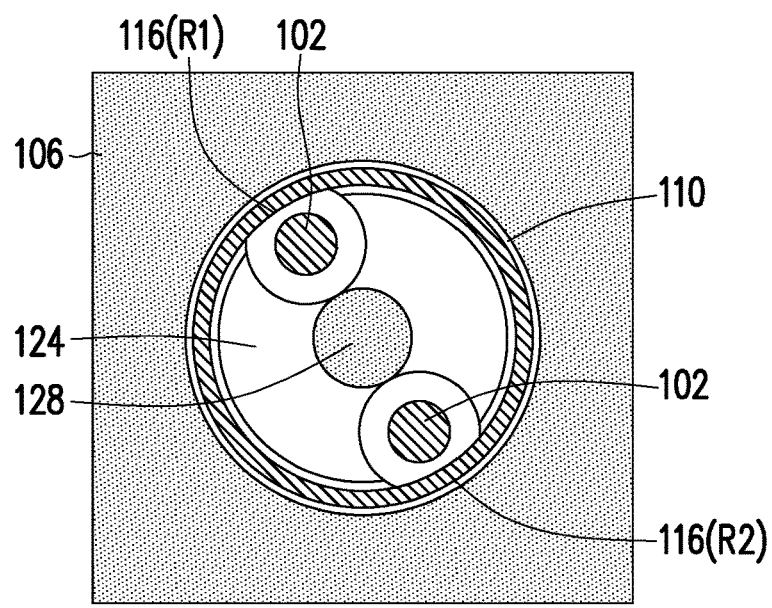
FIG. 5A to FIG. 5F show top views of line IV-IV' of FIG. 4A to FIG. 4F.

Referring to FIG. 4A and FIG. 5A, a stack structure SK1 is formed according to the above method, and an opening 108 is formed in the stack structure SK1. Next, a protection layer 110, a channel pillar 116, a spacer 117, an insulating filling layer 124, and an insulating pillar 128 are formed in the opening 108. Afterwards, a patterning process is performed to form holes 130a and 130b in the insulating filling layer 124. Then, an etch-back process is performed to remove the spacer 117 exposed on the sidewalls of the holes 130a and 130b, so as to expose a first region R1 and a second region R2 of the channel pillar 116. In this embodiment, a source pillar and a drain pillar will be fabricated using metal silicide formed by a self-aligned metal silicidation process. Therefore, a silicon layer that is sufficiently thick is required in the holes 130a and 130b. Therefore, in this embodiment, additional pillars 219a and 219b are further formed before the self-aligned metal silicidation process, as shown in FIG. 4B and FIG. 5B.

Figure 4B:
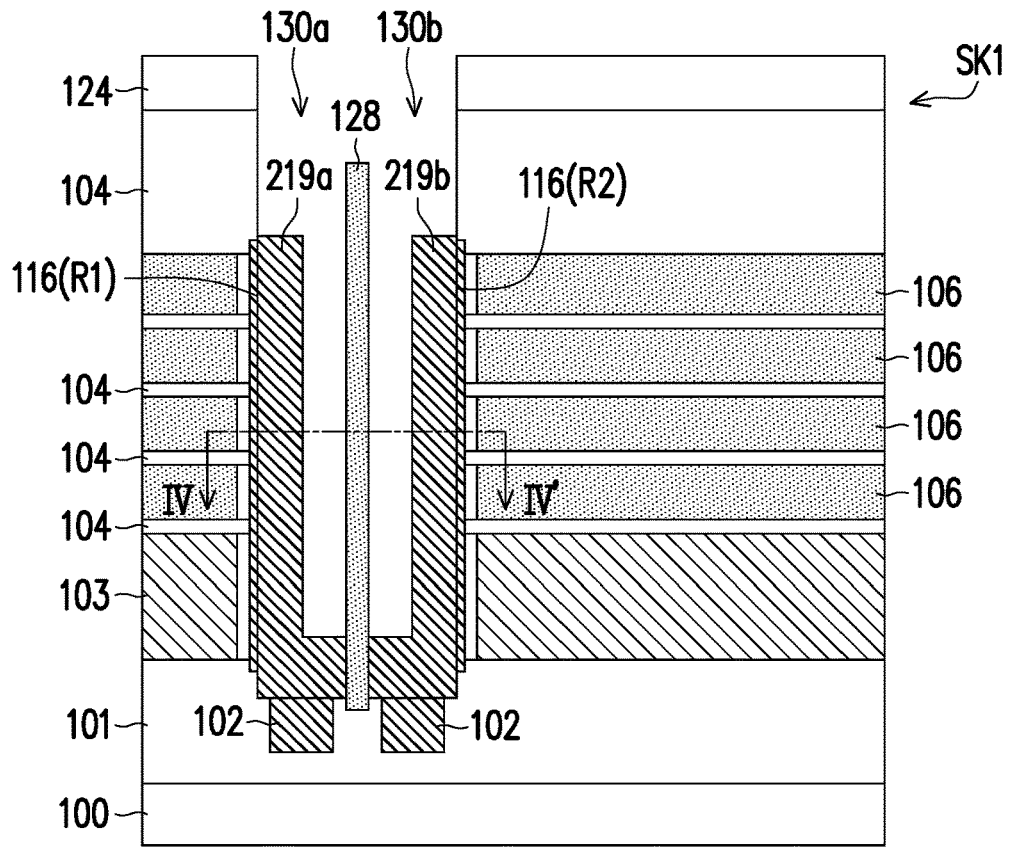
Figure 5B:
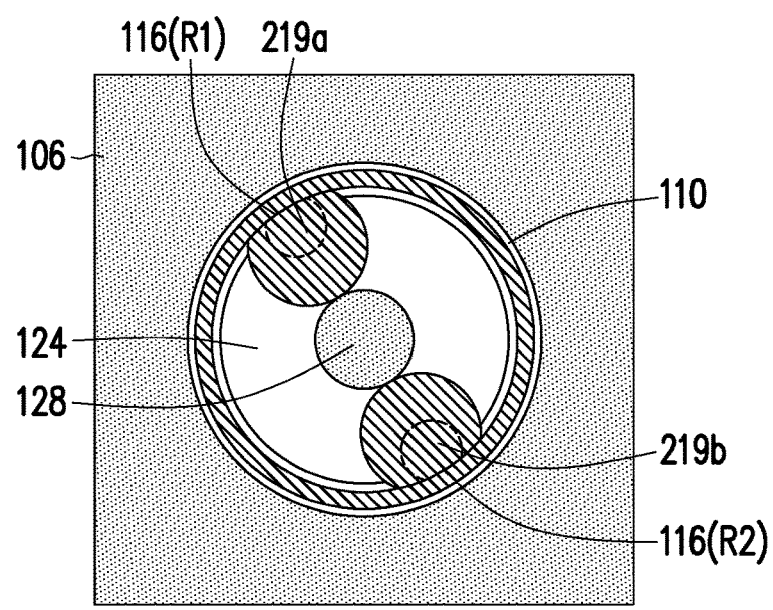

Referring to FIG. 4B and FIG. 5B, additional pillars 219a and 219b are formed in the holes 130a and 130b. In some embodiments, the additional pillars 219a and 219b continuously extend from the first region R1 and the second region R2 of the channel pillar 116 to the stop layer 102. The additional pillars 219a and 219b are, for example, epitaxial silicon layers, and the formation method thereof includes, for example, growing epitaxial layers by the epitaxial growth method respectively from the first region R1 and the second region R2 of the channel pillar 116 and the stop layer 102 until they are connected to each other. Compared to the additional pillars 119a and 119b shown in FIG. 2F, the additional pillars 219a and 219b of this embodiment are grown to have a larger thickness and occupy a relatively large space of the holes 130a and 130b, but do not fill up the holes 130a and 130b.

Figure 4C:
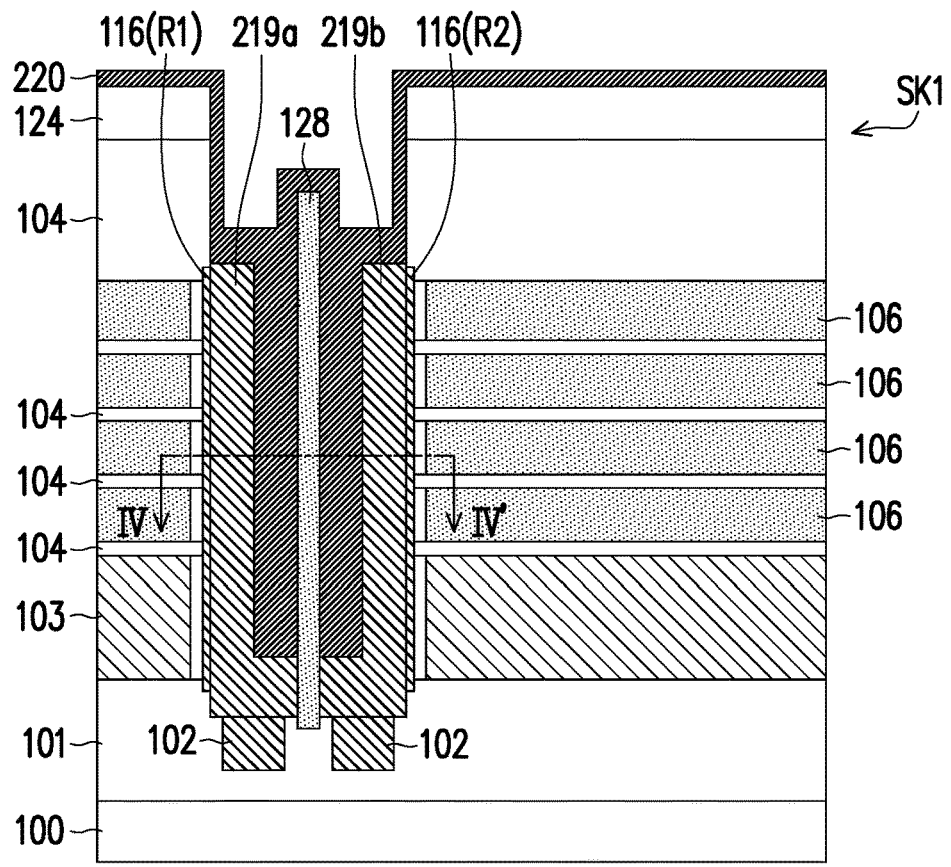
Figure 5C:
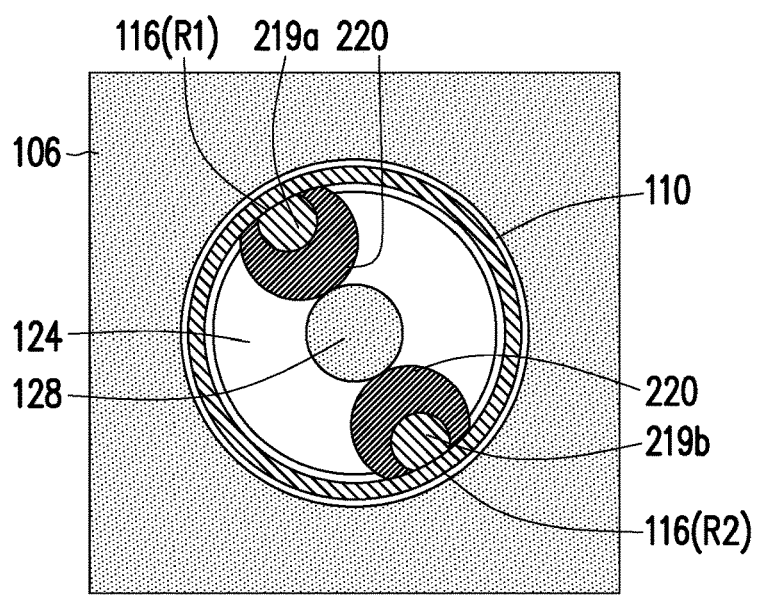

Referring to FIG. 4C and FIG. 5C, afterwards, a self-aligned metallization process is performed. First, a metal layer 220 is formed on the stack structure SK1 and in the holes 130a and 130b. The metal layer 220 covers the top surface and the sidewall of the stack structure SK1, the surfaces of the additional pillars 219a and 219b, and the top surface and the sidewall of the insulating pillar 128, and is filled in the remaining space of the holes 130a and 130b. The metal layer 220 is, for example, titanium, cobalt, nickel, platinum, or a combination thereof. The metal layer 220 is formed by, for example, the atomic layer deposition method, and the reacting gas source is, for example, $TiCl_4$.

Figure 4D:
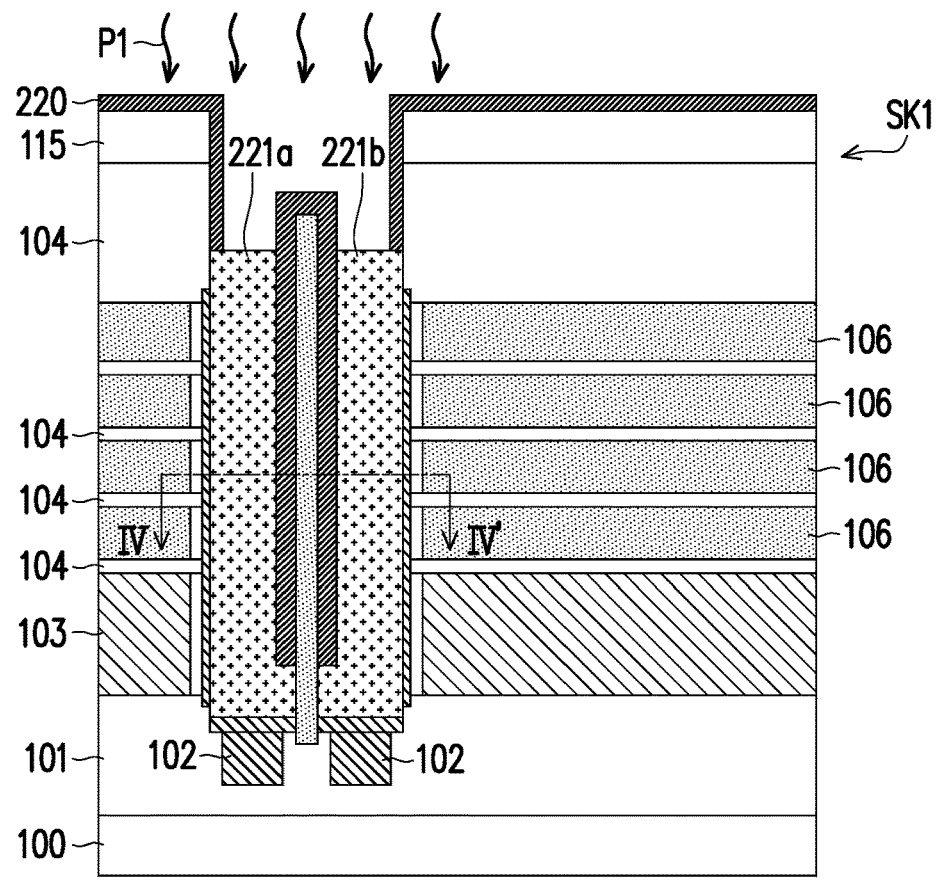
Figure 5D:
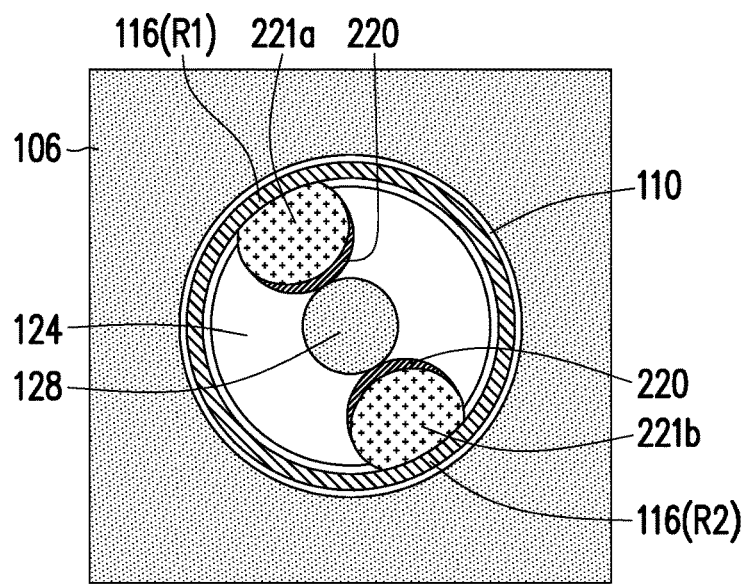

Referring to FIG. 4D and FIG. 5D, then, a thermal process P1 such as rapid thermal processing (RTP) is performed, so that the metal layer 220 reacts with the additional pillars 219a and 219b to form metal silicide pillars 221a and 221b. The material of the metal silicide pillars 221a and 221b is, for example, titanium silicide ($TiSi_2$), cobalt silicide, nickel silicide, platinum silicide, or a combination thereof.

Figure 4E:
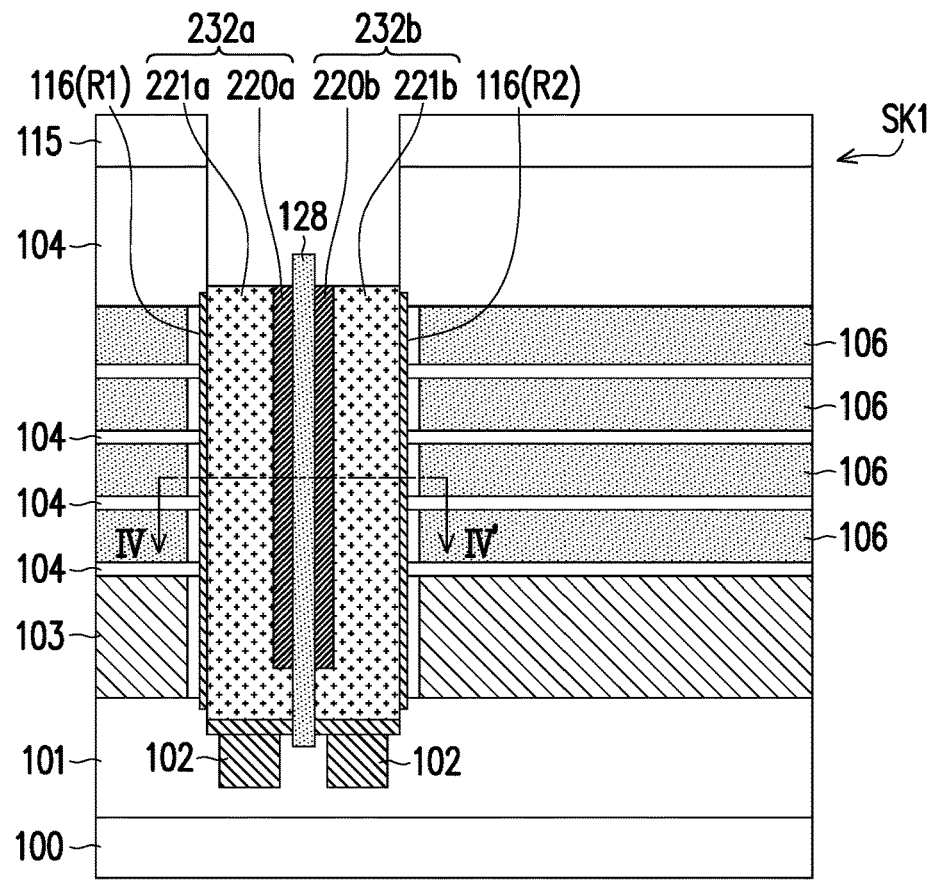
Figure 5E:
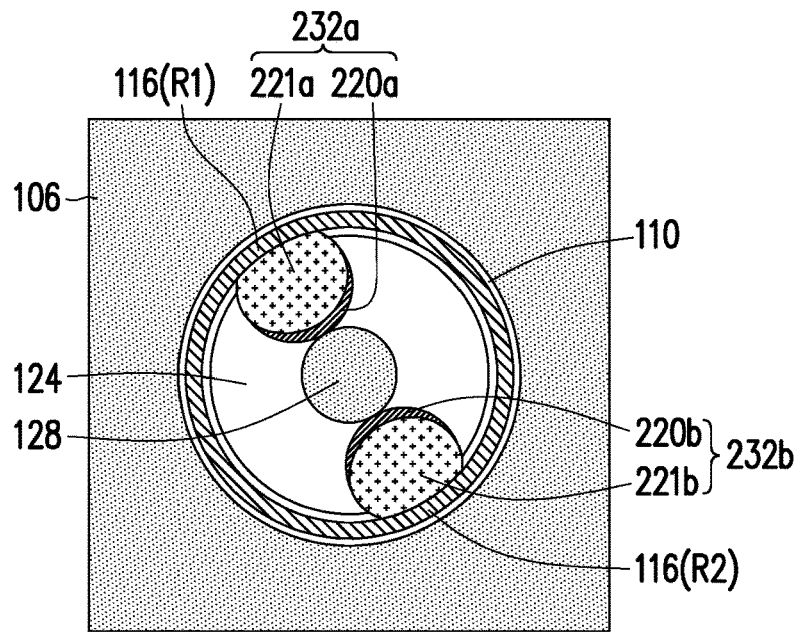
Figure 5F:
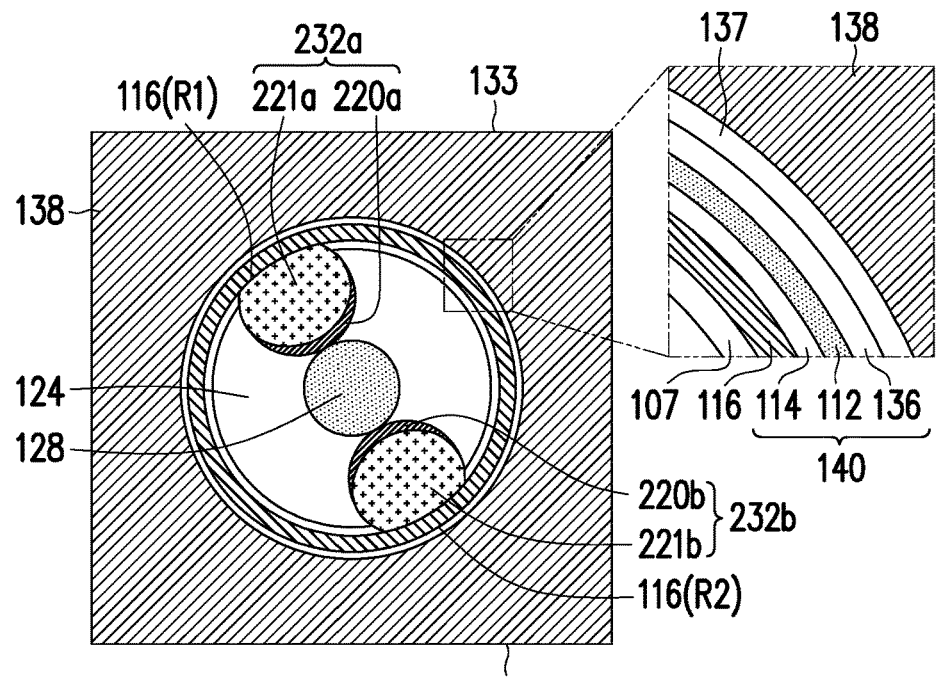

Referring to FIG. 4E and FIG. 5E, an etch-back process is performed on the unreacted metal layer 220 to form a metal layer 220a in the hole 130a and form a metal layer 220b in the hole 130b.

The metal layer 220a and the metal silicide pillar 221a may be collectively referred to as a conductive pillar 232a; the metal layer 220b and the metal silicide pillar 221b may be collectively referred to as a conductive pillar 232b. The conductive pillar 232a and the conductive pillar 232b may respectively serve as a source pillar and a drain pillar, and may be respectively electrically connected to the first region R1 and the second region R2 of the channel pillar 116.

In this embodiment, the metal silicide pillars 221a and 221b extend toward each other and protrude from the inner sidewall of the channel pillar 116, and are electrically connected to the first region R1 and the second region R2 of the channel pillar 116. The metal silicide pillars 221a and 221b are solid pillars, e.g., quasi-circular solid pillars. In this embodiment, the diameters of lower portions of the metal silicide pillars 221a and 221b are larger than the diameters of upper portions of the metal silicide pillars 221a and 221b. The lower portions of the metal silicide pillars 221a and 221b are separated by the insulating pillar 128. The upper portions of the metal silicide pillars 221a and 221b are separated by the insulating pillar 128 and the metal layers 220a and 220b.

The metal layers 220a and 220b include the same metal element as the metal silicide pillars 221a and 221b. The metal layer 220a is located between the metal silicide pillar 221a and the insulating pillar 128 and between the metal silicide pillar 221a and the insulating filling layer 124. The metal layer 220b is located between the metal silicide pillar 221b and the insulating pillar 128 and between the metal silicide pillar 221b and the insulating filling layer 124. The sidewalls and the bottoms of the metal layers 220a and 220b are covered by the metal silicide pillars 221a and 221b, and the metal layers 220a and 220b are separated from each other by the insulating pillar 128.

The resistances of the metal silicide pillars 221a and 221b are less than the resistance of the channel pillar 116, and the resistances of the metal silicide pillars 221a and 221b are between the resistance of the channel pillar 116 and the resistances of the metal layers 220a and 220b. The volumes of the metal silicide pillars 221a and 221b are equal to or larger than the volumes of the metal layers 220a and 220b but are not limited thereto.

Figure 4F:
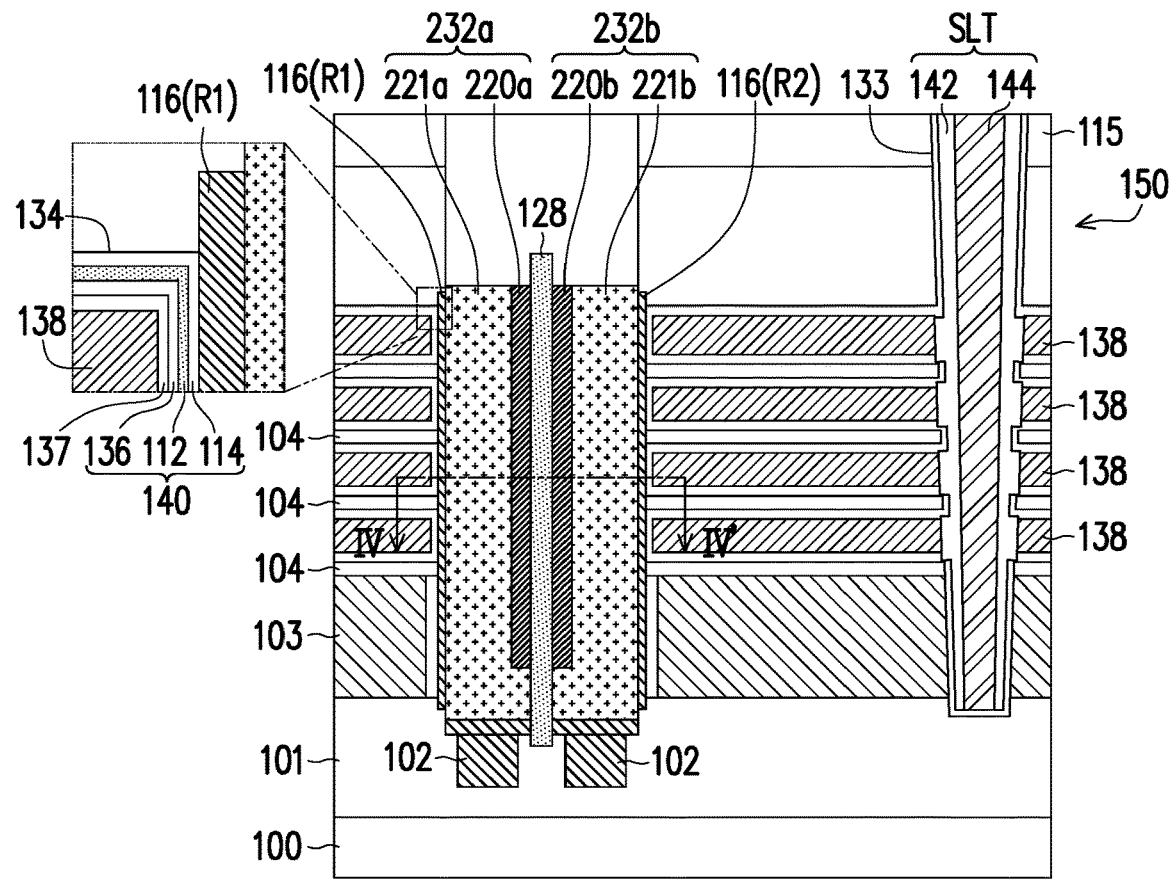

Next, referring to FIG. 4F and FIG. 5F, a cap insulating layer 115 is formed on the stack structure SK1. Afterwards, a replacement process is performed to replace the intermediate layers 106 with a plurality of tunneling layers 114, a plurality of charge storage layers 112, a plurality of blocking layers 136, a plurality of barrier layers 137, and a plurality of gate layers 138.

The above embodiments have been described by taking a 3D AND flash memory device as an example. However, the embodiment of the disclosure is not limited thereto. The disclosure may also be applied to a 3D NOR flash memory or a 3D NAND flash memory.

Based on the above, in the three-dimensional AND flash memory device of the embodiments of the disclosure, the source pillar and the drain pillar are fabricated using low-resistance metal and metal silicide, so the resistance of the source pillar and the drain pillar can be reduced, and the contact resistance between the source pillar/the drain pillar and the channel pillar can be reduced. Therefore, the on-current ($I_{on}$) can be increased. In addition, the method of fabricating the three-dimensional AND flash memory device of the embodiments of the disclosure may be integrated with the existing process to fabricate low-resistance source pillar and drain pillar and reduce the contact resistance between the source pillar/the drain pillar and the channel pillar.

What is claimed is:

1. A three-dimensional AND flash memory device comprising:
   a stack structure located on a dielectric substrate, wherein the stack structure comprises a plurality of gate layers and a plurality of insulating layers alternately stacked with each other;
   a channel pillar extending through the stack structure;
   a first conductive pillar and a second conductive pillar located in the channel pillar and electrically connected to the channel pillar, wherein the first conductive pillar comprises a first metal silicide pillar, and the second conductive pillar comprises a second metal silicide pillar; and
   a charge storage structure located between the gate layers and the channel pillar,
   wherein the first conductive pillar further comprises a first metal pillar, wherein the first metal silicide pillar is located between the channel pillar and the first metal pillar, and
   the second conductive pillar further comprises a second metal pillar, wherein the second metal silicide pillar is located between the channel pillar and the second metal pillar.

2. The three-dimensional AND flash memory device according to claim 1, wherein the first metal silicide pillar and the second metal silicide pillar respectively extend toward each other and protrude from an inner sidewall of the channel pillar.

3. The three-dimensional AND flash memory device according to claim 1, wherein a resistance of the first metal silicide pillar is less than or equal to a resistance of the channel pillar, and a resistance of the second metal silicide pillar is less than or equal to the resistance of the channel pillar.

4. The three-dimensional AND flash memory device according to claim 1, wherein a resistance of the first metal silicide pillar is between a resistance of the first metal pillar and a resistance of the channel pillar.

5. The three-dimensional AND flash memory device according to claim 1, wherein a volume of the first metal silicide pillar is smaller than or equal to a volume of the first metal pillar, and a volume of the second metal silicide pillar is smaller than or equal to a volume of the second metal pillar.

6. The three-dimensional AND flash memory device according to claim 1, wherein the first conductive pillar further comprises a first barrier layer located between the first metal silicide pillar and the first metal pillar, and
the second conductive pillar further comprises a second barrier layer located between the second metal silicide pillar and the second metal pillar.

7. The three-dimensional AND flash memory device according to claim 6, wherein
the first conductive pillar further comprises a first metal layer, wherein the first barrier layer is located between the first metal layer and the first metal pillar, and
the second conductive pillar further comprises a second metal layer, wherein the second barrier layer is located between the second metal layer and the second metal pillar, wherein the first metal layer is connected with the first metal silicide pillar to surround the first metal pillar together with the first metal silicide pillar, and the second metal layer is connected with the second metal silicide pillar to surround the second metal pillar together with the second metal silicide pillar.

8. The three-dimensional AND flash memory device according to claim 7, wherein the first metal layer and the second metal layer comprise a same metal element as the first metal silicide pillar and the second metal silicide pillar.

9. The three-dimensional AND flash memory device according to claim 7, wherein a volume of the first metal silicide pillar is larger than or equal to a volume of the first metal layer, and a volume of the second metal silicide pillar is larger than or equal to a volume of the second metal layer.

10. The three-dimensional AND flash memory device according to claim 7, wherein the first metal layer and the second metal layer comprise a same metal element as the first metal silicide pillar and the second metal silicide pillar.

11. A three-dimensional AND flash memory device, comprising:
a stack structure located on a dielectric substrate, wherein the stack structure comprises a plurality of gate layers and a plurality of insulating layers alternately stacked with each other;
a channel pillar extending through the stack structure;
a first conductive pillar and a second conductive pillar located in the channel pillar and electrically connected to the channel pillar, wherein the first conductive pillar comprises a first metal silicide pillar, and the second conductive pillar comprises a second metal silicide pillar; and
a charge storage structure located between the gate layers and the channel pillar,
wherein the first conductive pillar further comprises a first metal layer, wherein the first metal silicide pillar is located between the channel pillar and the first metal layer, and
the second conductive pillar further comprises a second metal layer, wherein the second metal silicide pillar is located between the channel pillar and the second metal layer.

12. A method of fabricating a three-dimensional AND flash memory device, comprising:
forming a stack structure on a dielectric substrate, wherein the stack structure comprises a plurality of intermediate layers and a plurality of insulating layers stacked alternately with each other;
forming a channel pillar extending through the stack structure;
forming a first additional pillar and a second additional pillar in the channel pillar, wherein the first additional pillar and the second additional pillar are respectively electrically connected to a part of the channel pillar;
reacting the first additional pillar and the second additional pillar to form a first metal silicide pillar and a second metal silicide pillar;
replacing the intermediate layers with a plurality of gate layers; and
forming a plurality of charge storage structures between the gate layers and the channel pillar,
wherein a method of forming the first metal silicide pillar and the second metal silicide pillar comprises:
forming a metal layer on the stack structure; and
performing a self-aligned metal silicidation reaction so that a part of the metal layer reacts with the first additional pillar and the second additional pillar to form the first metal silicide pillar and the second metal silicide pillar.

13. The method of fabricating a three-dimensional AND flash memory device according to claim 12, further comprising removing an unreacted part of the metal layer to form a first metal layer electrically connected to the first metal silicide pillar and form a second metal layer electrically connected to the second metal silicide pillar.

14. The method of fabricating a three-dimensional AND flash memory device according to claim 12, further comprising:
forming a first metal pillar extending through the stack structure and electrically connected to the first metal silicide pillar; and
forming a second metal pillar extending through the stack structure and electrically connected to the second metal silicide pillar.

15. The method of fabricating a three-dimensional AND flash memory device according to claim 14, further comprising:
forming a first barrier layer between the first metal silicide pillar and the first metal pillar; and
forming a second barrier layer between the second metal silicide pillar and the second metal pillar.

16. The method of fabricating a three-dimensional AND flash memory device according to claim 15, wherein a method of forming the first barrier layer and the second barrier layer comprises performing a surface treatment process on the first metal silicide pillar and the second metal silicide pillar.

17. The method of fabricating a three-dimensional AND flash memory device according to claim 16, wherein the surface treatment process comprises a nitridation process.

18. The method of fabricating a three-dimensional AND flash memory device according to claim 15, further comprising removing an unreacted part of the metal layer to form a first metal layer electrically connected to the first barrier layer and form a second metal layer electrically connected to the second barrier layer.

* * * * *